(12) United States Patent
Lee

(10) Patent No.: US 6,975,035 B2
(45) Date of Patent: Dec. 13, 2005

(54) METHOD AND APPARATUS FOR DIELECTRIC FILLING OF FLIP CHIP ON INTERPOSER ASSEMBLY

(75) Inventor: Teck Kheng Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 47 days.

(21) Appl. No.: 10/150,902

(22) Filed: May 17, 2002

(65) Prior Publication Data

US 2003/0164541 A1 Sep. 4, 2003

(30) Foreign Application Priority Data

Mar. 4, 2002 (SG) ..................................... 200201301-9

(51) Int. Cl.[7] .......................... H01L 23/12; H01L 23/52; H01L 23/45

(52) U.S. Cl. ......................... 257/778; 737/738; 737/787

(58) Field of Search ................................. 257/778, 737, 257/738, 777, 774, 787; 228/180.22; 438/108

(56) References Cited

U.S. PATENT DOCUMENTS

| | | | |
|---|---|---|---|
| 3,239,496 | A | 3/1966 | Jursich |
| 4,074,342 | A | 2/1978 | Honn et al. |
| 4,807,021 | A | 2/1989 | Okumura |
| 4,818,728 | A | 4/1989 | Rai et al. |
| 5,148,265 | A | 9/1992 | Khandros et al. |
| 5,346,861 | A | 9/1994 | Khandros et al. |
| 5,347,159 | A | 9/1994 | Khandros et al. |
| 5,366,794 | A | 11/1994 | Nakao |
| 5,385,869 | A | 1/1995 | Liu et al. |
| 5,386,341 | A | 1/1995 | Olson et al. |

(Continued)

FOREIGN PATENT DOCUMENTS

| | | |
|---|---|---|
| EP | 0475022 | 3/1992 |
| EP | 684644 | 11/1995 |
| EP | 0997942 | 5/2000 |
| EP | 1009027 | 6/2000 |
| JP | 04030456 | 2/1992 |
| JP | 2002-028702/04 | 9/1999 |
| JP | 2000-183082 | 6/2000 |
| JP | 02000230964 | 8/2000 |
| JP | 2001077294 | 3/2001 |
| KR | 2001054744 | 7/2001 |
| WO | WO 99/65282 | 12/1999 |

OTHER PUBLICATIONS

U.S. patent application entitled Microelectronic Devices and Methods of Manufacture, filed Aug. 30, 2001, Ser. No. 09/944,465.

Isaak, H. et al., "Development of Flex Stackable Carriers" IEEE Electronic Components and Technology Conference, 2000 Proceedings 50th, May 21, 2000–May 24, 2000, Las Vegas, NV, USA, pp. 378–384, IEEE Catalog No.: 00CH37070.

(Continued)

*Primary Examiner*—Jasmine Clark
(74) *Attorney, Agent, or Firm*—TraskBritt

(57) ABSTRACT

A method and apparatus for increasing the integrated circuit density in a flip chip semiconductor device assembly and decreasing the time for dielectrically filling such assembly using less dielectric material. The semiconductor device assembly includes a conductively bumped semiconductor die and an interposer substrate having multiple recesses formed therein. The semiconductor die is mounted to the interposer substrate with the bumps disposed in the multiple recesses so that the die face is directly adjacent a surface of the interposer substrate. One or more openings may be provided in an opposing lower surface of the interposer substrate or a periphery thereof which extends to the multiple recesses and the conductive bumps disposed therein. Dielectric filler material may then be provided through the one or more openings to the recesses.

75 Claims, 18 Drawing Sheets

U.S. PATENT DOCUMENTS

| | | |
|---|---|---|
| 5,397,921 A | 3/1995 | Karnezos |
| 5,404,044 A | 4/1995 | Booth et al. |
| 5,409,865 A | 4/1995 | Karnezos |
| 5,422,205 A | 6/1995 | Inoue et al. |
| 5,438,477 A | 8/1995 | Pasch |
| 5,448,511 A | 9/1995 | Paurus et al. |
| 5,468,681 A | 11/1995 | Pasch |
| 5,489,804 A | 2/1996 | Pasch |
| 5,504,277 A | 4/1996 | Danner |
| 5,598,033 A | 1/1997 | Behlen et al. |
| 5,646,446 A | 7/1997 | Nicewarner, Jr. et al. |
| 5,663,530 A | 9/1997 | Schueller et al. |
| 5,668,405 A | 9/1997 | Yamashita |
| 5,674,785 A | 10/1997 | Akram et al. |
| 5,679,977 A | 10/1997 | Khandros et al. |
| 5,683,942 A | 11/1997 | Kata et al. |
| 5,697,148 A | 12/1997 | Lance, Jr. et al. |
| 5,710,071 A | 1/1998 | Beddingfield et al. |
| 5,719,449 A | 2/1998 | Strauss |
| 5,721,151 A | 2/1998 | Padmanabhan et al. |
| 5,723,347 A | 3/1998 | Hirano et al. |
| 5,739,585 A | 4/1998 | Akram et al. |
| 5,742,100 A | 4/1998 | Schroeder et al. |
| 5,747,982 A | 5/1998 | Dromgoole et al. |
| 5,752,182 A | 5/1998 | Nakatsuka et al. |
| 5,758,413 A | 6/1998 | Chong et al. |
| 5,777,391 A | 7/1998 | Nakamura et al. |
| 5,798,285 A | 8/1998 | Bentlage et al. |
| 5,805,422 A | 9/1998 | Otake et al. |
| 5,812,378 A | 9/1998 | Fjelstad et al. |
| 5,818,113 A | 10/1998 | Iseki et al. |
| 5,821,624 A | 10/1998 | Pasch |
| 5,834,338 A | 11/1998 | Takeda et al. |
| 5,834,366 A | 11/1998 | Akram |
| 5,835,355 A | 11/1998 | Dordi |
| 5,843,808 A | 12/1998 | Karnezos |
| 5,844,168 A | 12/1998 | Schueller et al. |
| 5,866,953 A | 2/1999 | Akram et al. |
| 5,886,408 A | 3/1999 | Ohki et al. |
| 5,891,753 A | 4/1999 | Akram |
| 5,892,271 A | 4/1999 | Takeda et al. |
| 5,898,224 A | 4/1999 | Akram |
| 5,905,303 A | 5/1999 | Kata et al. |
| 5,973,389 A | 10/1999 | Culnane et al. |
| 5,973,404 A | 10/1999 | Akram et al. |
| 5,977,640 A | 11/1999 | Bertin et al. |
| 5,982,030 A | 11/1999 | MacIntrye |
| 5,984,691 A | 11/1999 | Brodsky et al. |
| 5,986,460 A | 11/1999 | Kawakami |
| 5,990,545 A | 11/1999 | Schueller et al. |
| 5,991,161 A | 11/1999 | Samaras et al. |
| 6,005,776 A | 12/1999 | Holman et al. |
| 6,008,543 A | 12/1999 | Iwabuchi |
| 6,011,694 A | 1/2000 | Hirakawa |
| 6,013,948 A | 1/2000 | Akram et al. |
| 6,020,629 A | 2/2000 | Farnworth et al. |
| 6,022,761 A | 2/2000 | Grupen-Shemansky et al. |
| 6,024,584 A | 2/2000 | Lemke et al. |
| 6,027,346 A | 2/2000 | Sinsheimer et al. |
| 6,028,365 A | 2/2000 | Akram et al. |
| 6,039,889 A | 3/2000 | Zhang et al. |
| 6,040,630 A * | 3/2000 | Panchou et al. ............ 257/783 |
| 6,048,755 A | 4/2000 | Jiang et al. |
| 6,050,832 A | 4/2000 | Lee et al. |
| 6,057,178 A | 5/2000 | Galuschki et al. |
| 6,060,782 A | 5/2000 | Ohsono et al. |
| 6,064,114 A | 5/2000 | Higgins, III |
| 6,072,233 A | 6/2000 | Corisis et al. |
| 6,074,897 A | 6/2000 | Degani et al. |
| 6,075,710 A | 6/2000 | Lau |
| 6,079,991 A | 6/2000 | Lemke et al. |
| 6,093,035 A | 7/2000 | Lemke et al. |
| 6,116,921 A | 9/2000 | Scholz et al. |
| 6,124,631 A * | 9/2000 | Cardot et al. ............... 257/667 |
| 6,127,736 A | 10/2000 | Akram |
| 6,133,072 A | 10/2000 | Fjelstad |
| 6,133,637 A | 10/2000 | Hikita et al. |
| 6,137,062 A | 10/2000 | Zimmerman |
| 6,137,164 A | 10/2000 | Yew et al. |
| 6,137,183 A * | 10/2000 | Sako ......................... 257/783 |
| 6,157,541 A | 12/2000 | Hacke |
| 6,165,885 A | 12/2000 | Gaynes et al. |
| 6,172,422 B1 | 1/2001 | Chigawa et al. |
| 6,177,723 B1 | 1/2001 | Eng et al. |
| 6,179,598 B1 | 1/2001 | Brand |
| 6,191,487 B1 | 2/2001 | Rodenbeck et al. |
| 6,208,521 B1 | 3/2001 | Nakatsuka |
| 6,208,525 B1 | 3/2001 | Imasu et al. |
| 6,212,768 B1 | 4/2001 | Murakami |
| 6,214,156 B1 | 4/2001 | Takano et al. |
| 6,217,343 B1 | 4/2001 | Okuno |
| 6,218,202 B1 | 4/2001 | Yew et al. |
| 6,219,911 B1 | 4/2001 | Estes et al. |
| 6,221,763 B1 | 4/2001 | Gilton et al. |
| 6,222,265 B1 | 4/2001 | Akram et al. |
| 6,225,688 B1 | 5/2001 | Kim et al. |
| 6,229,711 B1 | 5/2001 | Yoneda |
| 6,232,666 B1 | 5/2001 | Corisis et al. |
| 6,239,496 B1 | 5/2001 | Asada |
| 6,242,932 B1 | 6/2001 | Hembree |
| 6,262,895 B1 | 7/2001 | Forthun |
| 6,265,775 B1 | 7/2001 | Seyyedy |
| 6,271,469 B1 | 8/2001 | Ma et al. |
| 6,281,046 B1 | 8/2001 | Lam |
| 6,291,265 B1 | 9/2001 | Mess |
| 6,291,775 B1 * | 9/2001 | Saitoh ......................... 174/250 |
| 6,291,884 B1 | 9/2001 | Glenn et al. |
| 6,294,455 B1 | 9/2001 | Ahn |
| 6,295,730 B1 | 10/2001 | Akram |
| 6,300,679 B1 | 10/2001 | Mukerji et al. |
| 6,310,288 B1 | 10/2001 | Moden |
| 6,323,060 B1 | 11/2001 | Isaak |
| 6,338,985 B1 | 1/2002 | Greenwood |
| 6,376,769 B1 | 4/2002 | Chung |
| 6,404,648 B1 | 6/2002 | Slupe et al. |
| 6,407,450 B1 | 6/2002 | Verma et al. |
| 6,413,102 B2 * | 7/2002 | Jiang et al. .................... 439/70 |
| 6,429,516 B1 * | 8/2002 | Tsunoi ......................... 257/737 |
| 6,432,737 B1 | 8/2002 | Webster |
| 6,452,807 B1 | 9/2002 | Barrett |
| 6,468,831 B2 | 10/2002 | Leong et al. |
| 6,482,676 B2 | 11/2002 | Tsunoi et al. |
| 6,489,676 B2 | 12/2002 | Taniguchi et al. |
| 6,489,687 B1 * | 12/2002 | Hashimoto .................. 257/777 |
| 6,492,737 B1 * | 12/2002 | Imasu et al. ................. 257/778 |
| 6,515,324 B2 | 2/2003 | Shibuya et al. |
| 6,518,677 B1 * | 2/2003 | Capote et al. ............... 257/783 |
| 6,534,853 B2 | 3/2003 | Liu et al. |
| 6,552,910 B1 | 4/2003 | Moon et al. |
| 6,563,223 B2 | 5/2003 | Freeman |
| 6,586,830 B2 | 7/2003 | Saito |
| 6,600,222 B1 | 7/2003 | Levardo |
| 6,634,100 B2 | 10/2003 | Akram et al. |
| 6,714,418 B2 | 3/2004 | Frankowsky et al. |
| 6,730,855 B2 | 5/2004 | Bando |
| 6,744,122 B1 | 6/2004 | Hashimoto |
| 6,791,195 B2 | 9/2004 | Urushima |
| 2001/0048157 A1 | 12/2001 | Murtuza |
| 2001/0053563 A1 | 12/2001 | Kim et al. |
| 2002/0045611 A1 | 4/2002 | Abrams et al. |
| 2002/0079594 A1 | 6/2002 | Sakurai |

| | | |
|---|---|---|
| 2002/0142513 A1 | 10/2002 | Fee et al. |
| 2002/0167092 A1 | 11/2002 | Fee et al. |
| 2002/0185661 A1 | 12/2002 | Kawanobe et al. |
| 2003/0042595 A1 | 3/2003 | Canella |
| 2003/0134450 A1 | 7/2003 | Lee |
| 2004/0026773 A1 | 2/2004 | Koon et al. |
| 2004/0212055 A1 | 10/2004 | Exposito et al. |
| 2004/0217454 A1 | 11/2004 | Brechignac et al. |

OTHER PUBLICATIONS

Copy of Australian Patent Office, Search Report, May 30, 2003, 4 pages.

Al–Sarawi et al., "A review of 3–D packaging technology," Components, Packaging, and Manufacturing Technology, Part B: IEEE Transactions on Advanced Packaging, vol. 21, Issue 4, Nov. 1994, pp. 564–568.

Andros et al., "TBGA Package Technology," Components, Packaging, and Manufacturing Technology, Part B: IEEE Transactions on Advanced Packaging, vol. 17, Issue 4, Nov. 1994, pp. 564–568.

Clot et al., "Flip–Chip on Flex for 3D Packaging," 1999. 24th IEEE/CPMT, Oct. 18–19, 1999, pp. 36–41.

Ferrando et al., "Industrial approach of a flip–chip method using the stud–bumps with a non–conductive paste," Adhesive Joining and Coating Technology in Electronics Manufacturing, 2000. Proceedings. 4th International Conference on, 18–21, Jun. 2000, pp. 205–211.

Gallagher et al., "A Fully Additive, Polymeric Process for the Fabrication and Assembly of Substrate and Component Level Packaging," The First IEEE International Symposium on Polymeric Electronics Packaging, 26–30, Oct. 1997, pp. 56–63.

Geissinger et al., "Tape Based CSP Package Supports Fine Pitch Wirebonding," Electronics Manufacturing Technology Symposium, 2002, IEMT 2002, 27th Annual IEEE/SEMI International, Jul. 17–18, 2002, pp. 41–452.

Hatanaka, H., "Packaging processes using flip chip bonder and future directions of technology development," Electronics Packaging Technology Conference, 2002. 4th, Dec. 10–12, 2002, pp. 434–439.

Haug et al., "Low–Cost Direct Chip Attach: Comparison of SMD Compatible FC Soldering with Anisotropically Conductive Adhesive FC Bonding," IEEE Transactions on Electronics Packaging Manufacturing, vol. 23, No. 1, Jan. 2000, pp. 12–18.

Kloeser et al., "Fine Pitch Stencil Printing of Sn/Pb and Lead Free Solders for Flip Chip Technology," IEEE Transactions of CPMT—Part C, vol. 21, No. 1, 1998, pp. 41–49.

Lee et al., "Enhanced of Moisture Sensitivity Performance of a FBGA," Proceedings of International Symposium on Electronic Materials & Packaging, 2000, pp. 470–475.

Li et al., "Stencil Printing Process Development for Flip Chip Interconnect," IEEE Transactions Part C: Electronics Packaging Manufacturing, vol. 23, Issue 3, (Jul. 2000), pp. 165–170.

Lyons et al., "A New Approach to Using Anisotropically Conductive Adhesives for Flip–Chip Assembly, Part A," IEEE Transactions on Components, Packaging, and Manufacturing Technology, vol. 19, Issue 1, Mar. 1996, pp. 5–11.

Teo et al., "Enhancing Moisture Resistance of PBGA," Electronic Components and Technology Conference, 1988. 48th IEEE, May 25–28, 1998, pp. 930–935.

Teutsch et al., "Wafer Level CSP using Low Cost Electroless Redistribution Layer," Electronic Components and Technology Conference, 2000. 2000 Proceedings. 50th, May 21–24, 2000, pp. 107–113.

"The 2003 International Technology Roadmap for Semiconductor: Assembly and Packaging".

Tsui et al., "Pad redistribution technology for flip chip applications," Electronic Components and Technology Conference, 1998. 48th IEEE, May 25–28, 1998, pp. 1098–1102.

Xiao et al., "Reliability study and failure analysis of fine pitch solder–bumped flip chip on low–cost flexible substrate without using stiffener," IEEE, 2002. Proceedings 52nd, May 28–31, 2002, pp. 112–118.

Australian Search Report dated Aug. 11, 2004 (3 pages).

Australian Search Report dated Aug. 16, 2004 (4 pages).

Australian Search Report dated Nov. 8, 2004 (5 pages).

* cited by examiner

METHOD AND APPARATUS FOR DIELECTRIC FILLING OF FLIP CHIP ON INTERPOSER ASSEMBLY

CROSS-REFERENCE TO RELATED APPLICATIONS

This application is related to U.S. patent application Ser. No. 09/944,465 filed Aug. 30, 2001 and entitled MICROELECTRONIC DEVICES AND METHODS OF MANUFACTURE, and to the following U.S. patent applications filed on even date herewith: Ser. No. 10/150,893, entitled INTERPOSER CONFIGURED TO REDUCE THE PROFILES OF SEMICONDUCTOR DEVICE ASSEMBLIES AND PACKAGES INCLUDING THE SAME AND METHODS; Ser. No. 10/150,892, entitled METHOD AND APPARATUS FOR FLIP-CHIP PACKAGING PROVIDING TESTING CAPABILITY; Ser. No. 10/150,516, entitled SEMICONDUCTOR DIE PACKAGES WITH RECESSED INTERCONNECTING STRUCTURES AND METHODS FOR ASSEMBLING THE SAME; Ser. No. 10/150,653, entitled FLIP CHIP PACKAGING USING RECESSED INTERPOSER TERMINALS; and Ser. No. 10/150,901, entitled METHODS FOR ASSEMBLY AND PACKAGING OF FLIP CHIP CONFIGURED DICE WITH INTERPOSER.

BACKGROUND OF THE INVENTION

1. Field of the Invention

The present invention relates to methods and apparatus for assembling and packaging single and multiple semiconductor dice with an interposer substrate. In particular, the present invention relates to methods and apparatus for underfilling single and multiple semiconductor dice assembled in a flip chip orientation with an interposer substrate.

2. State of the Art

Chip-On-Board ("COB") or Board-On-Chip ("BOC") technology is used to attach a semiconductor die directly to a carrier substrate such as a printed circuit board ("PCB"), or an interposer may be employed and attachment may be effected using flip chip attachment, wire bonding, or tape automated bonding ("TAB").

Flip chip attachment generally includes electrically and mechanically attaching a semiconductor die by its active surface to an interposer or other carrier substrate using a pattern of discrete conductive elements therebetween. The discrete conductive elements are generally disposed on the active surface of the die during fabrication thereof, but may instead be disposed on the carrier substrate. The discrete conductive elements may comprise minute conductive bumps, balls or columns of various configurations. Each discrete conductive element is placed corresponding to mutually aligned locations of bond pads (or other I/O locations) on the semiconductor die and terminals on the carrier substrate when the two components are superimposed. The semiconductor die is thus electrically and mechanically connected to the carrier substrate by, for example, reflowing conductive bumps of solder or curing conductive or conductor-filled epoxy bumps. A dielectric underfill may then be disposed between the die and the carrier substrate for environmental protection and to enhance the mechanical attachment of the die to the carrier substrate.

Wire bonding and TAB attachment techniques generally begin with attaching a semiconductor die by its back side to the surface of a carrier substrate with an appropriate adhesive, such as an epoxy or silver solder. In wire bonding, a plurality of fine wires is discretely attached to bond pads on the semiconductor die and then extended and bonded to corresponding terminal pads on the carrier substrate. A dielectric encapsulant, such as a silicone or epoxy, may then be applied to protect the fine wires and bond sites. In TAB, ends of metal traces carried on a flexible insulating tape, such as a polyimide, are attached, as by thermocompression bonding, directly to the bond pads on the semiconductor die and corresponding terminal pads on the carrier substrate.

Higher performance, lower cost, increased miniaturization of components, and greater packaging density of integrated circuits are ongoing goals of the computer industry. As new generations of integrated circuit products are released, the number of components used to fabricate them tends to decrease due to advances in technology even though the functionality of the products increases. For example, on the average, there is approximately a ten percent decrease in components for every product generation over the previous generation having equivalent functionality.

Recent trends in packaging are moving with increasing rapidity toward flip chip attachment due to improved electrical performance and greater packaging density. However, flip chip attachment is not without problems, such as the high cost for a third metal reroute of bond pads from the middle or periphery of a die to a two-dimensional array which, in turn, may result in overlong and unequal-length electrical paths. In addition, many conventional flip chip techniques exhibit a lack of consistent reliability of the interconnections between the chip and the interposer or other carrier substrate as a result of the increased miniaturization as well as difficulties in mutual alignment of the die and carrier substrate to effect such interconnections. Effective rerouting of bond pads may also be limited by die size.

Further, flip chip packages for a bumped semiconductor die employing an interposer may be undesirably thick due to the combined height of the die and interposer. This is due to the use in conventional packaging techniques of relatively costly interposers comprising dual conductive layers having a dielectric member sandwiched therebetween, the bumped semiconductor die resting on and connected to traces of the conductive layer on one side of the interposer and electrically connected to traces of the conductive layer on the opposing side, conductive vias extending therebetween. Finally, underfilling a flip chip-attached semiconductor die to a carrier substrate with dielectric filler material can be a lengthy and often unreliable process, and the presence of the underfill makes reworking of defective assemblies difficult if not impossible.

Other difficulties with conventional packages include an inability to accommodate die size reductions, or "shrinks," as a given design progresses through several generations without developing new interposer designs and tooling. As more functionality is included in dice, necessitating a greater number of inputs and outputs (I/Os), decreased spacing or pitch between the I/Os places severe limitations on the use of conventional interposers. In addition, with conventional packages, a die is not tested until package assembly is complete, resulting in excess cost since a defective die or die and interposer assembly is not detected until the package is finished.

For example, U.S. Pat. No. 5,710,071 to Beddingfield et al. discloses a fairly typical flip chip attachment of a semiconductor die to a substrate and a method of underfilling a gap between the semiconductor die and substrate. In particular, the semiconductor die is attached face down to the substrate, wherein conductive bumps on the die are directly bonded to bond pads on the upper surface of the substrate, which provides the gap between the die and substrate. The underfill material flows through the gap between the semiconductor die and the substrate via capillary action toward an aperture in the substrate, thereby expelling air in the gap through the aperture in the substrate in an effort to minimize voids in the underfill material. However, such an underfilling method still is unnecessarily time consuming due to having to underfill the entire semiconductor die. Further, the flip chip attachment technique disclosed in U.S. Pat. No. 5,710,071 exhibits difficulties in aligning the conductive bumps with the bond pads on the substrate and requires the expense of having a third metal reroute in the substrate.

Therefore, it would be advantageous to improve the reliability of interconnections between a chip and a carrier substrate such as an interposer by achieving accurate alignment of the interconnections, an improved underfill process, and the elimination of the necessity for a third metal reroute, while reducing total assembly height in combination with the ability to employ commercially available, widely practiced semiconductor device fabrication techniques and materials.

BRIEF SUMMARY OF THE INVENTION

The present invention relates to methods and apparatus for assembling and packaging individual and multiple semiconductor dice with a carrier substrate in a flip chip-type arrangement, including methods and apparatus for underfilling a flip chip-configured semiconductor die assembled with a carrier substrate. The present invention provides a flip chip semiconductor assembly substantially reduced in height or depth in comparison to conventional interposer-based flip chip assemblies and with improved mechanical and electrical reliability of the interconnections between a semiconductor die and a carrier substrate in the form of an interposer, while also improving ease of alignment for attaching the semiconductor die to the carrier substrate and eliminating the requirement for a third metal reroute as well as reducing the time and quantity of material required for optional dielectric underfilling of the flip chip assembly while enhancing reliability thereof.

The flip chip semiconductor device assembly of the present invention includes a conductively bumped semiconductor die assembled active surface, or face, down with an interposer substrate. The present invention includes multiple recesses formed from one surface of the interposer substrate and through the dielectric layer thereof to conductive elements in the form of conductive terminals or traces on the opposing surface, the recesses configured in a predetermined recess pattern that corresponds substantially with the bond pad, and hence conductive bump, pattern or configuration of the bumped semiconductor die. Such predetermined recess patterns may include, for example, a single or double row center bond pad configuration, an I-shaped bond pad configuration and a peripheral bond pad configuration.

An adhesive element may be optionally disposed between the semiconductor die and interposer substrate to mutually secure same, in addition to any bond between the conductive bumps and terminals or traces. The adhesive element may comprise a tape having a thickness, which may be used to provide and control a vertical standoff between the active surface and the interposer substrate and to increase compliancy of the attachment of the semiconductor die and interposer substrate as well as facilitating rework. In addition, the adhesive element assists to resolve minor variances in vertical travel of die pick-and-place equipment used to place a semiconductor die on the interposer substrate and helps maintain the die securely in position on the interposer substrate during subsequent handling, fabrication steps and transportation from one location to another.

The flip chip semiconductor device assembly is assembled so that the conductive bumps on the semiconductor die are disposed in the recesses formed in the interposer substrate, the recesses being sized and configured to receive the bumps on the bumped semiconductor die so that they are submerged within the recesses to an extent that the active surface of the semiconductor die may sit directly against the surface of the interposer substrate onto which the recesses open. Thus, there is a reduction in the height of the flip chip semiconductor device assembly relative to conventional interposer-based flip chip assemblies due to the disposition of the conductive bumps within the recesses, which allows for the conductive bumps on the semiconductor die to be of larger size for increased reliability without increasing the overall height or depth of the flip chip semiconductor device assembly while avoiding the need for a third metal reroute on the semiconductor die. Even if an adhesive element using a tape is employed, the conductive bumps may still be substantially completely received within the recesses, but for the small vertical standoff provided by the tape.

The conductive bumps may be bonded to the conductive terminals at the bottoms of the recesses by reflowing the bumps, curing the bumps, ultrasonic bonding of the bumps to the terminals, thermal compression bonding of the bumps to the terminals, or by other techniques known in the art, depending upon the bump material selected. Further, a conductive paste or other nonsolid conductive material may be provided on the bumps or within the recesses prior to disposing the bumps in the recesses. Alternatively, bumps in the form of solder balls may be disposed in the recesses prior to alignment of the semiconductor die with the interposer substrate, or higher melting point metal or alloy bumps may be provided in a conductive paste in the recesses or on the bumps, after which the die may be aligned with the interposer substrate and attached thereto. In addition to enhancing electrical connection reliability between the conductive bumps and the interposer terminals, a nonsolid conductive material may be used to compensate for any noncoplanarity between the semiconductor die and interposer substrate due to varied bump sizes, recess depths and planarity variation in the opposing, adjacent surfaces of the semiconductor die and interposer substrate. As noted, an adhesive element on the surface of the interposer substrate facing the semiconductor die may be used in some embodiments as a height controller and may also help compensate for any irregularities in the coplanarity between the semiconductor die and the interposer substrate.

The semiconductor device assembly of the present invention may also be configured with one or more openings extending through the interposer substrate at a location or locations from the surface facing or facing away from the semiconductor die to provide communication between the one or more openings to each of the multiple recesses in the interposer substrate. This configuration facilitates dispensing of dielectric filler material through the opening or openings into the recesses and around the bumps. The opening or openings may be substantially coincident with the configuration of recesses and comprise gaps between conductive pad or terminal portions of conductive traces extending across the recesses or may comprise slots over, or laterally offset from, the recesses and in communication therewith and, if offset, a side of each recess being open to the slot. In the first and second instances, dielectric filler material may be introduced directly into the recesses through the gaps between the sides of the conductive trace extending over each recess and the periphery of the recess wall adjacent the trace. In the latter instance, dielectric filler material may be introduced into the slots to travel laterally therefrom into the recesses. Further, if a vertical standoff is employed between the interposer substrate and the semiconductor die, dielectric filler material may be introduced through a slot or other opening through the interposer substrate in the center region thereof and caused to flow therefrom into the recesses through the mouths thereof, even if not in communication with the opening, and to the periphery of the semiconductor die (if desired) through the standoff. A solder mask applied to the side of the interposer substrate facing away from the semiconductor die for forming solder bumps on the conductive elements of the interposer substrate, as noted below, may also be employed as a dam to prevent flow of underfill material through openings extending through the dielectric layer of the interposer substrate. This aspect of the present invention substantially enhances underfill integrity while decreasing process time.

The flip chip semiconductor device assembly of the present invention may also include solder balls or other discrete external conductive elements attached to the terminals or conductive traces extending from the terminals over the surface of the interposer substrate facing away from the semiconductor die. The discrete external conductive elements are employed to interconnect the semiconductor device assembly with higher-level packaging, such as a carrier substrate, for example, in the form of a printed circuit board. The semiconductor die of the flip chip semiconductor device assembly may be fully or partially encapsulated by a dielectric encapsulation material or may be left exposed.

In another aspect of the present invention, a heat transfer element may be included with the flip chip semiconductor device assembly. In particular, the heat transfer element may be included on the surface of the interposer substrate facing the semiconductor die, the active surface of the semiconductor die, or the back side of the semiconductor die. Such heat transfer element may be used to lower the operating temperature of the assembly as well as to prevent thermal fatigue.

The flip chip semiconductor device assembly of the invention may include an unencapsulated semiconductor die, a partially encapsulated semiconductor die, or a fully encapsulated semiconductor die.

The interposer substrate of the present invention may also be assembled with a plurality of semiconductor dice at a wafer or partial wafer level, wherein a wafer or partial wafer including a plurality of unsingulated semiconductor dice is attached face down to a like-sized interposer substrate with bumps on the wafer or partial wafer submerged in recesses formed in the interposer substrate. Filler material may be dispensed through openings in the interposer substrate, after which the wafer or partial wafer and interposer substrate may be diced into individual flip chip semiconductor device assemblies. Encapsulation may be performed at least partially at the wafer level and completed, if desired, after being diced into individual semiconductor assemblies.

The interposer substrate may be fabricated from a flexible material including a flexible dielectric member, a conductive member, an adhesive on the flexible dielectric member and a solder mask over the conductive member. The flexible dielectric member may comprise a polyimide layer which overlies the solder mask with the conductive member therebetween. The conductive member comprises a pattern of conductive traces formed by etching of a conductive layer carried by the flexible dielectric member or by printing traces on the flexible dielectric member using conductive ink. Trace ends may be enlarged at the intended locations of the recesses to define pads for the terminals, and the traces may extend therefrom to enlarged bump pads sized and placed for formation of external conductive elements thereon for connection to higher-level packaging. The recesses may be formed through the flexible dielectric member from the surface thereof opposite the conductive member by etching, mechanical drilling or punching, or laser ablation, wherein each of the recesses extends to a terminal of a conductive trace and is sized and configured to receive a conductive bump of the semiconductor die. The flexible dielectric member may also optionally include another patterned conductive layer thereon over the surface of the flexible dielectric member to face the semiconductor die. The interposer substrate of the present invention may also be formed of other interposer substrate materials such as a BT resin, FR4 laminate, FR5 laminate and ceramics.

In another aspect of the present invention, the flip chip semiconductor device assembly is mounted to a circuit board in a computer or a computer system. In the computer system, the circuit board is electrically connected to a processor device which electrically communicates with an input device and an output device.

Other features and advantages of the present invention will become apparent to those of skill in the art through a consideration of the ensuing description, the accompanying drawings and the appended claims.

BRIEF DESCRIPTION OF THE SEVERAL VIEWS OF THE DRAWINGS

While the specification concludes with claims particularly pointing out and distinctly claiming that which is regarded as the present invention, the advantages of this invention may be ascertained from the following description of the invention when read in conjunction with the accompanying drawings, wherein:

FIGS. 24A–24B illustrate a method of assembling the flip chip-type semiconductor assembly according to the present invention at a wafer level, wherein: FIG. 24A illustrates a wafer positioned face down prior to being attached to an interposer substrate of the present invention; and FIG. 24B illustrates the wafer attached face down to the interposer substrate;

DETAILED DESCRIPTION OF THE INVENTION

Figure 1:
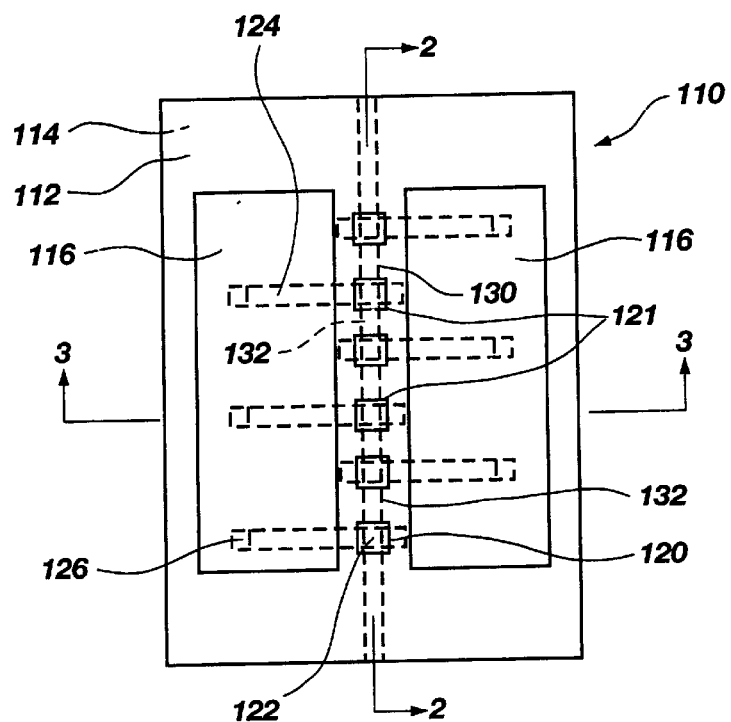
FIG. 1 is a simplified top view of an interposer substrate having recesses therein in a center row configuration according to the present invention.

Embodiments of the present invention will be hereinafter described with reference to the accompanying drawings. It would be understood that these illustrations are not to be taken as actual views of any specific apparatus or method of the present invention, but are merely exemplary, idealized representations employed to more clearly and fully depict the present invention than might otherwise be possible. Additionally, elements and features common between the drawing figures retain the same numerical designation.

Figure 2:
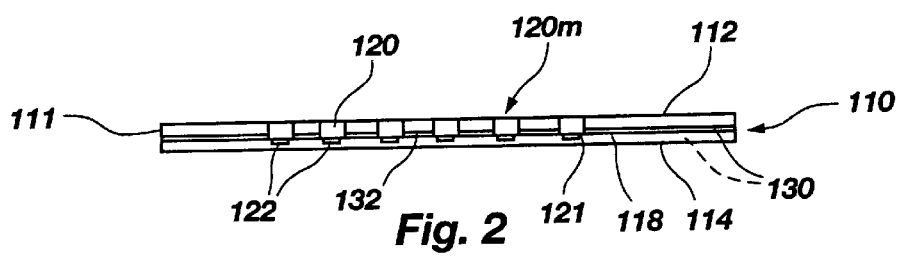
FIG. 2 is a simplified cross-sectional side view taken along line 2—2 in FIG. 1.

FIGS. 1 and 2, respectively, depict a simplified top plan view of an interposer substrate 110 and a longitudinal sectional view. The interposer substrate 110 is preferably, but not limited to, a flexible substrate, which may include a dielectric substrate member 111 and a protective solder mask 118. The dielectric substrate member 111 may define a first surface 112 of the interposer substrate 110 and the solder mask 118 may define a second surface 114 of the interposer substrate 110.

The interposer substrate 110 may be formed from any known substrate material and is preferably formed of, by way of example, a flexible laminated polymer or polyimide layer, such as UPILEX®, produced by Ube Industries, Ltd., or any other polymer-type layer. The interposer substrate 110 may also be made of a bismaleimide triazine (BT) resin, FR4, FR5 or any type of substantially nonflexible material, such as a ceramic or epoxy resin.

According to the present invention, the first surface 112 of interposer substrate 110 includes multiple recesses or vias 120 formed therein having mouths 120m opening thereonto in a preselected pattern and of a predetermined size and shape. The multiple recesses or vias 120 each include a conductive pad or terminal 122 at a bottom thereof. The conductive pads or terminals 122 are interconnected to other conductive pads 126 on a second surface 114 of interposer substrate 110. Such conductive pads 126 may be substantially directly below conductive pads or terminals 122 and merely comprise an opposing surface thereof or, more typically, the conductive pads 126 may be placed at various predetermined locations laterally offset and remote from their associated conductive pads or terminals 122 and electrically connected thereto by conductive traces 124 (shown in FIG. 1 in broken lines).

The multiple recesses 120 are formed in the interposer substrate 110 in a preselected pattern to correspond with a bond pad configuration formed on an active surface of a semiconductor die intended to be attached thereto. For example, FIG. 1 depicts the multiple recesses 120 in a centrally aligned, single-row configuration in interposer substrate 110. Such configuration is made to correspond and attach to a bumped semiconductor die having a centrally aligned, single-row bond pad configuration which will be more fully illustrated hereafter. Other preselected patterns, by way of example, may include an I-shaped recess configuration (FIG. 25) or a peripheral recess configuration (FIG. 26); however, the present invention may be adapted to any recess configuration to match with any particular, desired bond pad configuration. In addition, the multiple recesses 120 may be formed in any suitable shape, such as square, rectangular and circular, and may include tapered sidewalls so that the openings or mouths of the recesses 120 are larger than the bottoms thereof.

It will be observed in FIG. 1 that conductive traces 124 extend over recesses 120 and may optionally extend therebeyond, if desired, for enhanced adhesion of conductive traces 124 to dielectric substrate member 111. Conductive pads or terminals 122 may completely cover the bottoms of recesses 120 or, as depicted in FIG. 1, may be narrower than recesses 120 at the bottoms thereof so that gaps 121 are defined on one or both sides of conductive pads or terminals 122. As implied above, the conductive traces, which may, for example, comprise copper or a copper alloy, may be adhered to the dielectric substrate member of UPILEX®, BT resin, FR4 or, FR5 laminate material, or other substrate materials, using adhesives as known in the art. In some instances, the material of the conductive traces may be adhesively laminated to the dielectric substrate member in the form of a conductive sheet, the traces then being subtractively formed from the conductive sheet, as by etching.

Figure 1A:
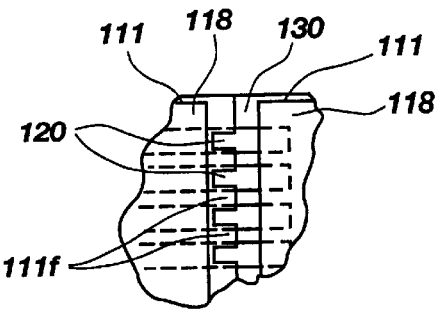
FIG. 1A is a simplified bottom view of another interposer substrate design for a center row configuration according to the present invention.

Further, interposer substrate 110 may also include an opening 130 (shown in broken lines) formed thereacross, the opening 130 substantially extending along a longitudinal extent of the centrally aligned, single-row configuration of the multiple recesses 120 from one end of interposer substrate 110 to the other. Opening 130 may be formed wholly in the material of dielectric substrate member 111, or may, as shown by the broken lead line from reference numeral 130 in FIG. 2 and the broken lead line from reference numeral 130 in FIG. 3, be formed in solder mask 118. Of course, opening 130 may be formed partially in dielectric substrate member 111 and partially in solder mask 118, as desired. Opening 130 may be formed to align along any employed recess configuration, i.e., I-shape or peripheral. To better illustrate opening 130, FIG. 2 depicts a cross-sectional view taken along lines 2—2 in FIG. 1. As illustrated, opening 130 includes multiple segments 132, each segment 132 extending between separate individual recesses 120 of the multiple recesses 120. Further, each segment 132 as shown extends along the axis of opening 130 to a side portion of each of the recesses 120; however, the segments 132 may extend and be positioned from the opening 130 to the recesses 120 in any suitable manner. For example, and as depicted in FIG. 1A, opening 130 may comprise a slot laterally offset from recesses 120, which are themselves defined between fingers 111*f* of flexible dielectric substrate member 111 which terminate at opening 130. As shown, conductive traces 124 extend across opening 130, and solder mask 118 covers the end portions thereof flanking opening 130 and providing an enhanced depth and width to opening 130 for underfilling purposes.

Figure 3:
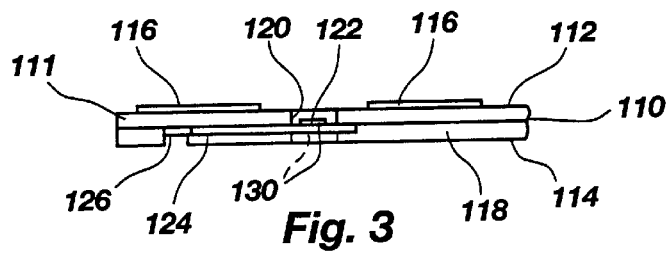
FIG. 3 is a simplified cross-sectional side view take along line 3—3 in FIG. 1.

To further illustrate opening 130, FIG. 3 is a cross-sectional view taken along lines 3—3 of FIG. 1. FIG. 3 depicts opening 130 extending directly into the recesses 120, i.e., into the plane of the drawing sheet. Such opening 130 is shown as having a lateral width smaller than the recesses 120; however, the opening may be sized substantially equal to, or larger than, the lateral width of the recesses 120. FIG. 3 also depicts conductive pads or terminals 122 at the bottom of each of the recesses 120 interconnected through conductive traces 124 with conductive pads 126 exposed at the second surface 114 of the interposer substrate 110 through solder mask 118.

FIGS. 1 and 3 also depict an adhesive element 116 disposed on the first surface 112 of the interposer substrate 110. Such adhesive element 116 is preferably disposed on a portion of the first surface 112 of the interposer substrate 110 that is adjacent but separated from each of the multiple recesses 120. The adhesive element 116 may be any suitable adhesive material as known in the art, such as an epoxy, acrylic, or other suitable adhesive. The adhesive element 116 may comprise, without limitation, a polyimide tape bearing adhesive on both sides thereof with the exposed surface (facing away from dielectric substrate member 111) being covered with a protective release layer until adherence to a semiconductor die is required. Such adhesive element 116 is preferably of, but not limited to, a maximum 25 $\mu$m thickness. As described in more detail later herein, adhesive element 116 may be employed to function as a spacer between a semiconductor die and interposer substrate 110 to provide a vertical standoff therebetween or to control the degree of insertion of conductive bumps carried by the semiconductor die into recesses 120.

Figure 4A:
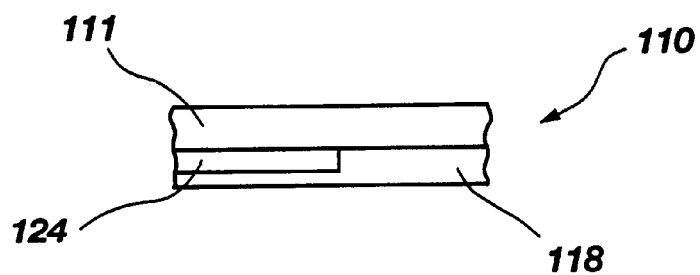
FIGS. 4A–4C illustrate an interposer substrate and a method of forming recesses therein according to the present invention.
Figure 4B:
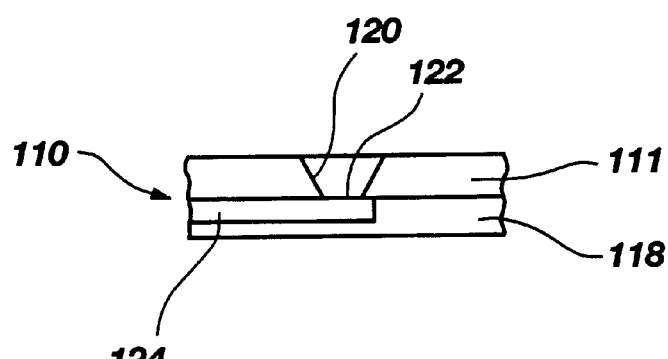
Figure 4C:
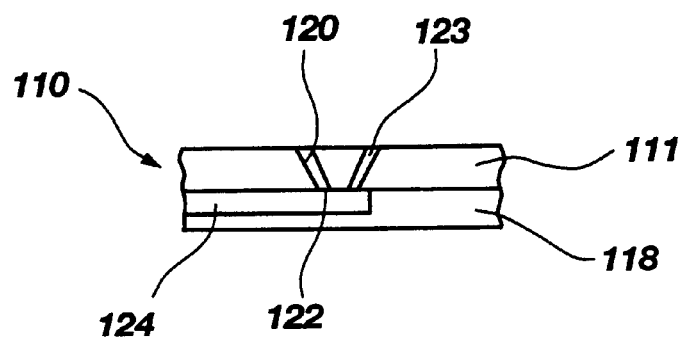

FIGS. 4A through 4C depict a process that may be used for forming the recesses 120 in the first surface 112 of interposer substrate 110. FIG. 4A depicts interposer substrate 110 including a dielectric substrate member 111 having a bottom conductive layer formed on a surface thereof and a protective solder mask 118 formed over the conductive layer. The dielectric substrate member 111 is preferably a flexible material, such as the above-described flexible laminated polymer material or polyimide layer, but may also include a substantially nonflexible material. The bottom conductive layer is preferably copper, or a copper alloy, but may be any suitable electrically conductive material. The bottom conductive layer may comprise conductive traces 124 extending between conductive pads or terminals 122 and conductive pads 126 (see FIG. 3). Such conductive traces 124 may be formed by masking and etching a bottom metal or alloy conductive layer or, alternatively, the conductive traces 124 may be formed by printing using conductive ink, or otherwise formed using any method known in the art. Once the conductive traces 124 are patterned, the protective solder mask 118 may be formed thereover.

FIG. 4B depicts dielectric substrate member 111 with one of the recesses 120 formed therein. Such recesses 120 may be formed by patterning, utilizing a chemical wet etch or dry etch, mechanical drilling or punching, laser ablation, or any method known in the art and suitable for use with the type of material employed for the dielectric substrate member 111. The recesses 120 are preferably formed to expose portions of one of the conductive traces 124, such as conductive pads or terminals 122. At a bottom of each recess 120 and, for example, at the location of each conductive pad or terminal 122, additional conductive material may be placed, such as gold or eutectic tin/lead solder, the material selected being compatible with the conductive material of the conductive traces 124 and with the bumps of a semiconductor die to be mated with interposer substrate 110 FIG. 4C illustrates that the walls of the recesses 120 may include a conductive layer 123 formed thereon, for example, by electroless plating; however, such plating is not required for practice of the present invention. Further and as shown in FIGS. 4B and 4C, recesses may be formed with large mouths which taper to a smaller bottom. Such tapering may be easily effected using isotropic etching techniques as known in the art.

Figure 5A:
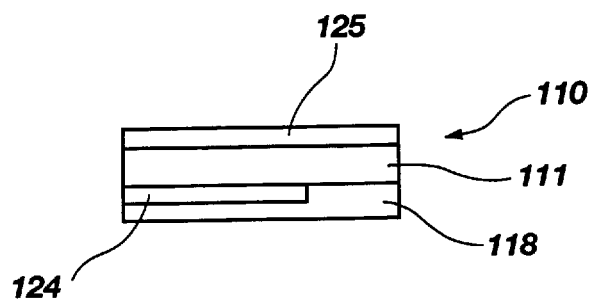
FIGS. 5A–5D illustrate another interposer substrate and a method of forming recesses therein according to the present invention.
Figure 5B:
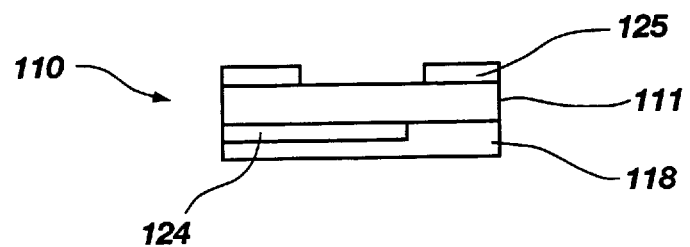
Figure 5C:
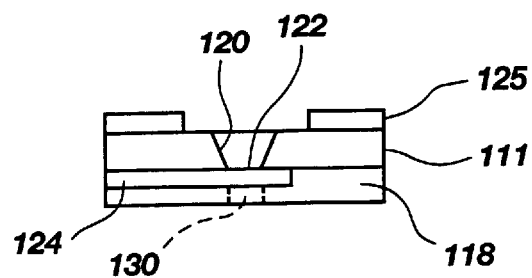
Figure 5D:
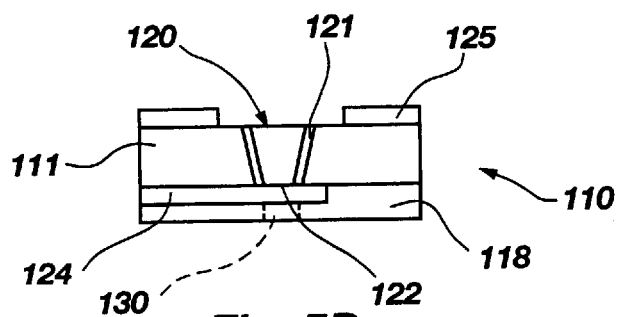

FIGS. 5A through 5D depict a process similar to that depicted and described in FIGS. 4A–4C of forming recesses 120 in the first surface 112 of interposer substrate 110, with the addition of another layer, namely, a second conductive layer 125, as shown in FIG. 5A. Such second conductive layer 125 is preferably a copper or copper alloy layer, but may be any suitable electrically conductive material, and may be patterned with traces, depending on the needs and requirements of the particular semiconductor die to which the interposer substrate 110 is attached. FIG. 5B depicts second conductive layer 125 patterned to expose portions of dielectric substrate member 111 where the recesses 120 are to be formed and substantially etched back from the intended lateral boundaries of the recess mouths. As shown in FIG. 5C, a recess 120 is then formed in the exposed portions of dielectric substrate member 111 by a chemical wet etch or dry etch, mechanical drilling or punching or laser ablation; however, the recess 120 may be formed utilizing any method known in the art and suitable with the type of material employed for the interposer substrate 110. The recesses 120 are preferably formed to expose conductive pads or terminals 122 of the conductive traces 124, after which additional conductive material may be placed over the exposed portion of the conductive pads or terminals 122. As before, a conductive layer 123 may be formed by electroless plating on the walls of the recesses 120 so that such conductive layer 123 contacts a portion of the conductive pads or terminals 122 of the exposed conductive traces 124, as depicted in FIG. 5D. As shown in FIGS. 5A through 5D in solid lines, solder mask 118 may provide full coverage over the bottoms of conductive traces 124 or, as shown in broken lines, may include an aperture or apertures therethrough, for example, to provide an opening 130 to expose the undersides of conductive traces 124 at the locations of recesses 120 or otherwise, as desired, for enhanced underfill access. If a wet solder mask 118 is employed, recesses 120 in dielectric substrate member 111 are plugged with a removable material before solder mask application; if a dry (film) solder mask 118 is employed, it may merely be laminated to dielectric substrate member 111.

Figure 6A:
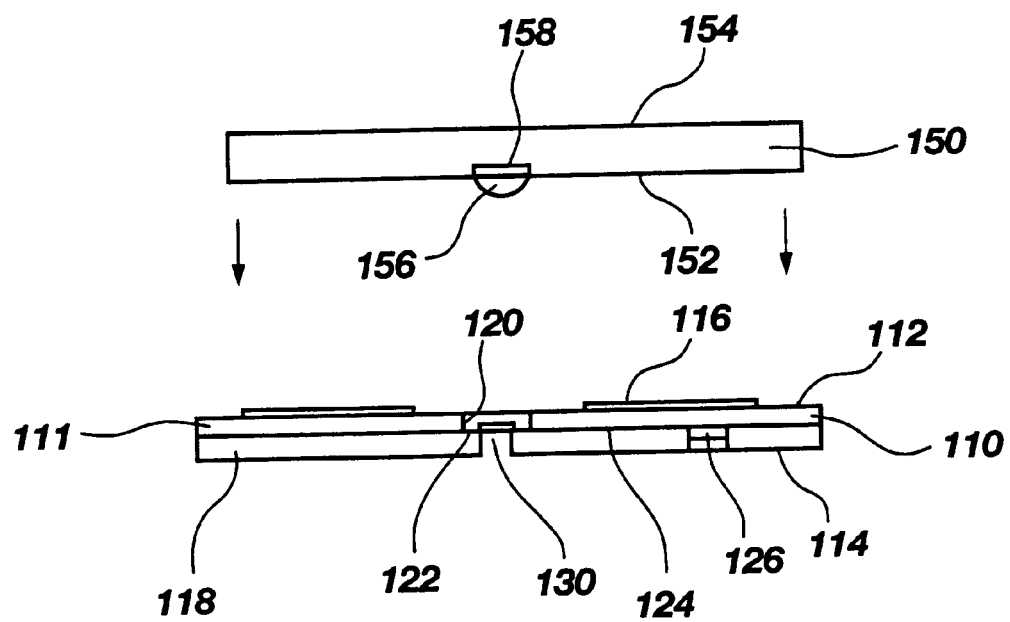
FIGS. 6A–6B illustrate a first method of mounting a semiconductor die face down to an interposer substrate in a flip chip-type semiconductor device assembly according to the present invention.
Figure 6B:
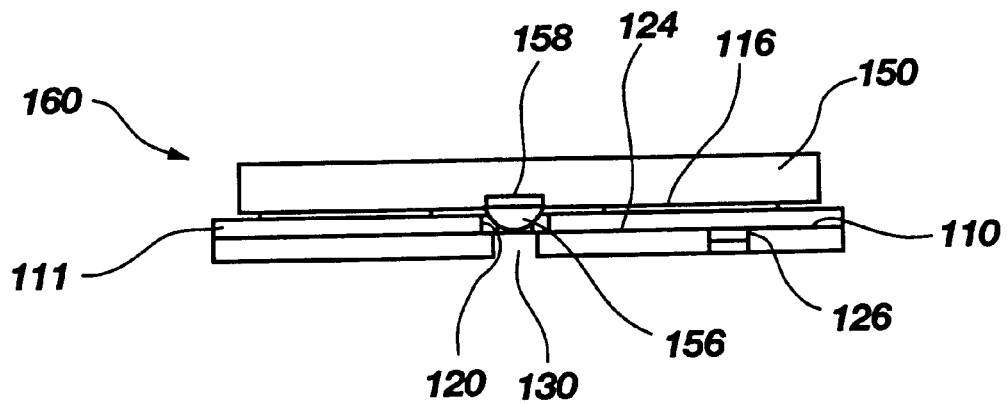

FIGS. 6A–6B depict simplified cross-sectional views of a first method of mounting and bonding interposer substrate 110 to a semiconductor die 150 in a flip chip-type semiconductor device assembly 160. FIG. 6A illustrates the first surface 112 of interposer substrate 110 aligned and facing the semiconductor die 150 prior to the assembly thereof. Semiconductor die 150 includes an active surface 152 and a back side or surface 154, wherein the active surface 152 includes a plurality of bond pads 158 bearing electrically conductive bumps 156 thereon. Such conductive bumps 156 and bond pads 158 of semiconductor die 150 are of a preselected configuration, wherein the recesses 120 in interposer substrate 110 are sized and configured to correspond with the configuration of the bond pads 158 and conductive bumps 156 of semiconductor die 150 so that the respective configurations or patterns of recesses 120 and conductive bumps 156 are substantially mirror images of each other. As shown, solder mask 118 may have an opening 130 defined therethrough or, alternatively, full solder mask coverage may be provided across the bottoms of conductive traces 124, including the locations of recesses 120 as previously described with respect to FIGS. 5A through 5D.

Conductive bumps 156 preferably comprise, but are not limited to, conductive balls, pillars or columns. The material of conductive bumps 156 may include, but is not limited to, any known suitable metals or alloys thereof, such as lead, tin, copper, silver or gold. Conductive or conductor-filled polymers may also be employed, although gold and PbSn solder bumps are currently preferred. The conductive bumps 156 may be of uniform characteristics therethroughout or include, for example, a core of a first material (including a nonconductive material) having one or more conductive layers of other materials thereon. Conductive bumps 156 are preferably formed on the active surface 152 of each semiconductor die 150 at a wafer level, but such is not required. Conductive bumps 156 may be formed by metal evaporation, electroplating, stencil printing, gold stud bumping by wire bonders, or any suitable method known in the art.

FIG. 6B depicts interposer substrate 110 mounted to semiconductor die 150 to form flip chip semiconductor device assembly 160, wherein such assembly 160 provides that each of the conductive bumps 156 is substantially inserted in a corresponding recess 120 of interposer substrate 110 and engages with the conductive pad or terminal 122 at the bottom of each of the recesses 120. Such semiconductor device assembly 160 may be initially attached by the adhesive element 116 carried on the first surface 112 of the interposer substrate 110. The conductive bumps 156 on the semiconductor die 150 may then be bonded to the conductive pads or terminals 122 in the recesses 120 of interposer substrate 110 by, for example, reflowing the conductive bumps 156 (in the case of solder bumps) or curing the conductive bumps 156 (in the case of conductive or conductor-filled polymer bumps) as known in the art. Other methods of bonding known in the art may be utilized, such as ultrasonic or thermal compression.

Figure 7A:
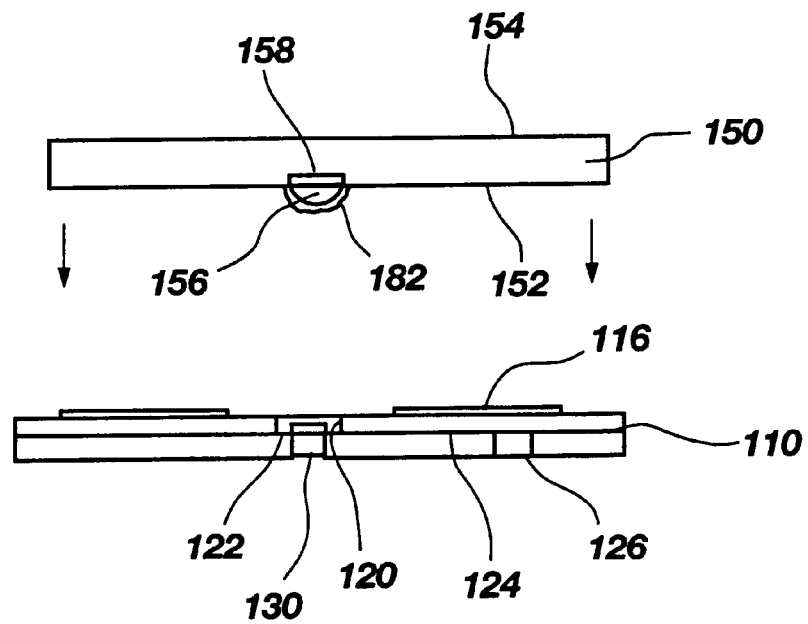
FIGS. 7A–7B illustrate a second method of mounting a semiconductor die face down to an interposer substrate in a flip chip semiconductor device assembly according to the present invention.
Figure 7B:
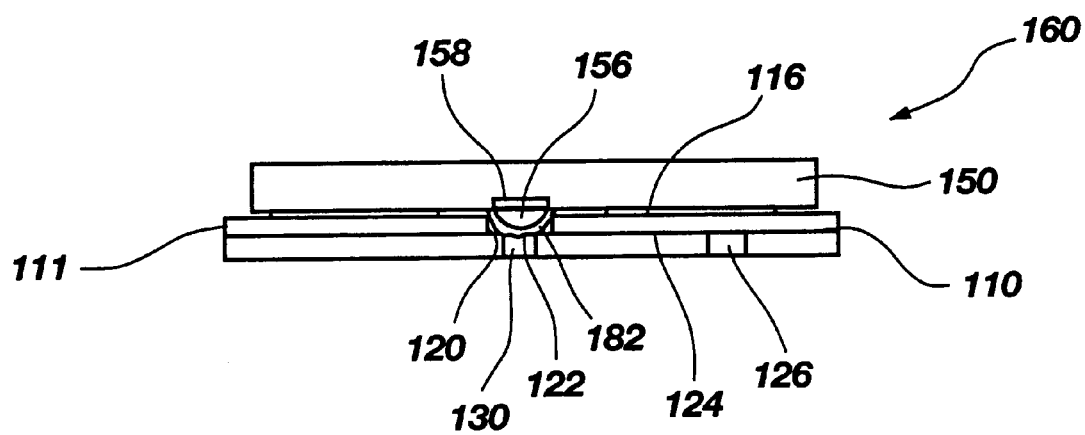

FIGS. 7A–7B depict simplified cross-sectional views of a second method of mounting and bonding interposer substrate 110 to a semiconductor die 150 in a flip chip semiconductor device assembly 160. FIG. 7A illustrates the first surface 112 of interposer substrate 110 aligned with and facing the semiconductor die 150 prior to the assembly thereof. FIG. 7A is similar to FIG. 6A in substantially every respect, except the conductive bumps 156 on the semiconductor die 150 carry a conductive paste 182 thereon. Such conductive paste 182 may be provided on the bumps by dipping the conductive bumps 156 into a pool of conductive paste 182 or by depositing, dispensing or otherwise transferring the conductive paste 182 to the conductive bumps 156. The conductive paste 182 may include, but is not limited to, eutectic solder, conductive epoxy, or any nonsolid conductive material known in the art. As shown, solder mask 118 may have an opening 130 defined therethrough or, alternatively, full solder mask coverage may be provided across the bottoms of conductive traces 124, including the locations of recesses 120 as previously described with respect to FIGS. 5A through 5D.

As depicted in FIG. 7B, the interposer substrate 110 is mounted to semiconductor die 150 to form semiconductor device assembly 160, wherein each of the conductive bumps 156 is substantially inserted into a corresponding recess 120 of interposer substrate 110 with the conductive paste 182 engaging with the conductive pad or terminal 122 in each of the recesses 120. With this arrangement, the conductive paste 182 provides contact with the conductive pads or terminals 122 even if some of the conductive bumps 156 are inconsistent in height, i.e., their free ends are noncoplanar. Such conductive bumps 156 having the conductive paste provided thereon may then be bonded to the conductive pads or terminals 122 in the recesses 120 of interposer substrate 110 as previously described in association with FIGS. 6A and 6B.

Figure 8A:
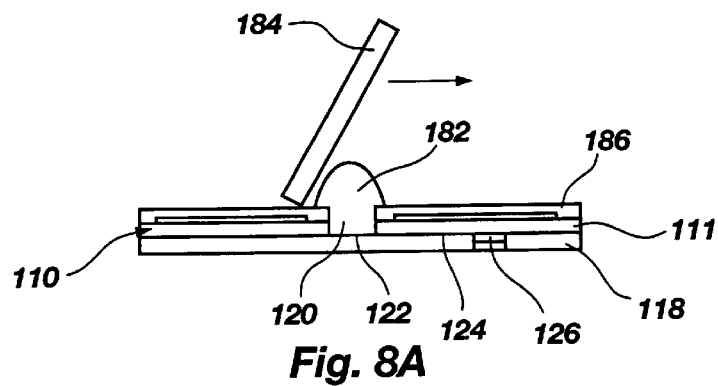
FIGS. 8A–8D illustrate a third method of mounting a semiconductor die face down to an interposer substrate in a flip chip semiconductor device assembly according to the present invention.
Figure 8B:
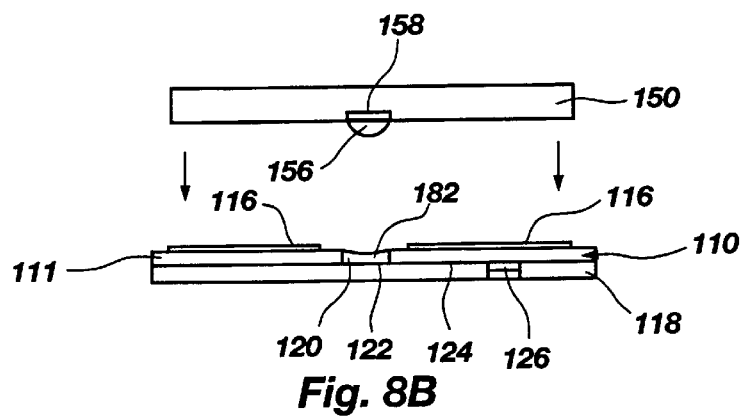

FIGS. 8A–8D depict simplified cross-sectional views of a third method of preparing, mounting and bonding interposer substrate 110 with a semiconductor die 150 in a flip chip-type semiconductor device assembly 160. FIG. 8A depicts interposer substrate 110 having a mass of conductive paste 182 disposed over a stencil 186, patterned with openings which correspond with recesses 120. The conductive paste 182 is then spread by a spreading member 184 over the stencil 186 so that the conductive paste 182 is deposited in each of the recesses 120. The stencil 186 is then removed prior to aligning the conductive bumps 156 on the semiconductor die 150 with the recesses 120 in the interposer substrate 110, as depicted in FIG. 8B. Alternatively, conductive paste 182 may be disposed into recesses 120 without using a stencil 186, using the surface of dielectric substrate member 111 itself as a stencil.

Figure 8C:
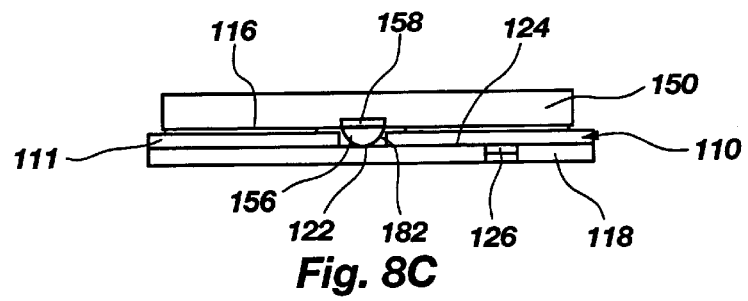
Figure 8D:
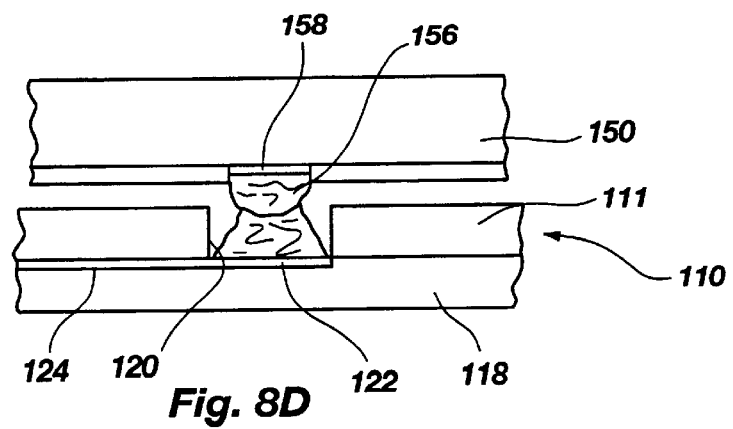

With the conductive paste 182 in the recesses 120, FIG. 8C depicts the interposer substrate 110 mounted to semiconductor die 150 to form semiconductor device assembly 160, wherein each of the conductive bumps 156 is substantially inserted into the conductive paste 182 in the corresponding recesses 120 of interposer substrate 110. As previously described in FIG. 7B, the conductive paste 182 provides electrical and mechanical interconnection between the conductive pads or terminals 122 or trace ends and the conductive bumps 156 even if some of the conductive bumps 156 are inconsistent in height, i.e., their free ends are noncoplanar. The semiconductor die 150 may then be bonded with the interposer substrate 110 as previously described in association with FIGS. 6A and 6B. It will be understood, as noted above, that stencil 186 may not be required if the mass of conductive paste 182 is disposed and spread into recesses 120 prior to disposition of an adhesive element 116 over first surface 112. Moreover, it will be understood that conductive paste 182, if eutectic solder, may be disposed in recesses 120 and then reflowed and solidified prior to attachment of semiconductor die 150 to interposer substrate 110 using a second reflow to provide an indefinite shelf life for interposer substrate 110. Alternatively, semiconductor die 150 may be aligned with interposer substrate 110 after conductive paste disposition and a single reflow employed. FIG. 8D is an enlarged view of a single conductive bump 156 carried by a semiconductor die 150 in initial contact with a mass of conductive paste 182 disposed in a recess 120 in dielectric substrate member 111 of interposer substrate 110 over conductive pad or terminal 122 of a conductive trace 124.

As a further alternative, a conductive bump 156 to be used either in cooperation with or in lieu of a conductive bump 156 carried by semiconductor die 150 may be formed in each of recesses 120 through plating of conductive pads or terminals 122 with a conductive material such as a suitable metal. Such plating may be effected electrolytically, using a bus line connected to each conductive trace 124, or by electroless plating, both techniques being well known in the art.

Figure 9A:
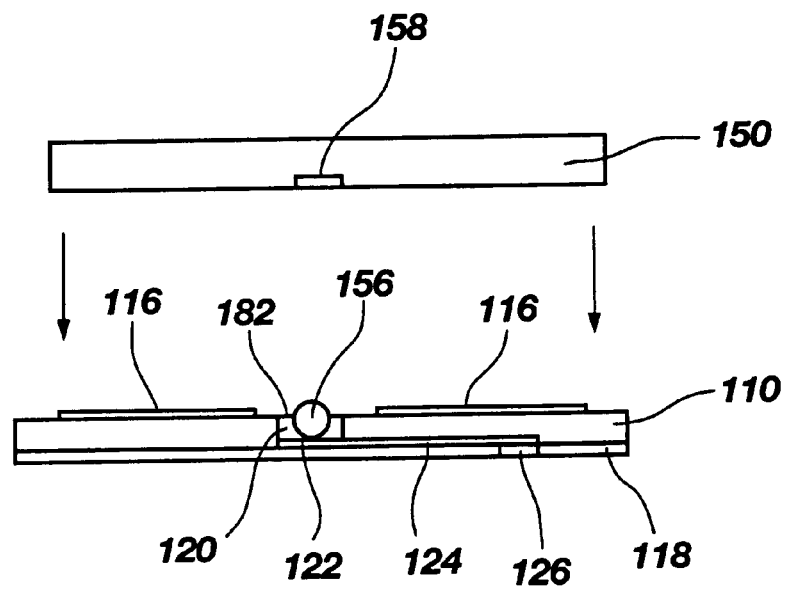
FIGS. 9A–9B illustrate a variant of the third method of mounting a semiconductor die face down to an interposer substrate in a flip chip semiconductor device assembly according to the present invention.
Figure 9B:
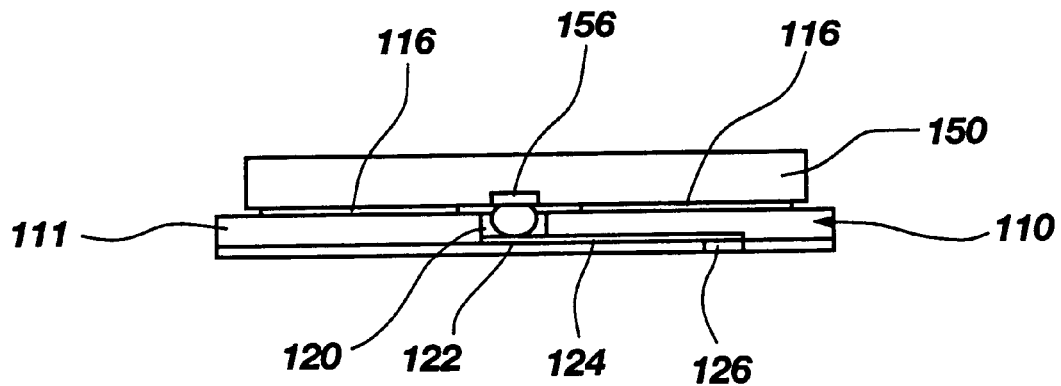

FIGS. 9A–9B depict simplified cross-sectional views of a variant of the above-described third method comprising a fourth method of preparing, mounting and bonding interposer substrate 110 to a semiconductor die 150 in a flip chip semiconductor device assembly 160. Such variant is similar to the third method as described in FIGS. 8A–8D of providing conductive paste in each of the recesses 120, except the conductive bumps 156 are initially unattached to the bond pads 158 of the semiconductor die 150. As depicted in FIG. 9A, the conductive bumps 156 in the form of balls, such as metal balls, are embedded into the conductive paste 182, which was previously spread into the recesses 120 of the interposer substrate 10. The bond pads 158 in the semiconductor die 150 are aligned with the conductive bumps 156 in the recesses 120 in the interposer substrate 110 and then mounted thereto, as depicted in FIGS. 9A–9B. The conductive paste 182 may comprise a solder wettable to both bond pads 158 and conductive pads or terminals 122 or a conductive or conductor-filled adhesive. It will also be understood and appreciated that conductive bumps 156 may themselves comprise solder, such as a PbSn solder, and conductive paste 182 eliminated, or also comprising a compatible solder.

As a further alternative and as previously described with respect to FIGS. 8A and 8B, a conductive bump 156 to be used in lieu of a conductive bump 156 carried by semiconductor die 150 may be formed in each of recesses 120 through plating of conductive pads or terminals 122 with a conductive material such as a suitable metal.

It will be well appreciated by one of ordinary skill in the art that, since the bumps are bonded within the recesses 120 of the interposer substrate 110 itself, the height of the flip chip semiconductor device assembly 160 is minimized. Therefore, conductive bumps 156 maybe formed larger in size than those of conventional flip chip assemblies without increasing, or even while decreasing, the height of the flip chip semiconductor device assembly 160, resulting in the increase in electrical and mechanical reliability and performance of the interconnections between the interposer substrate 110 and the semiconductor die 150. Further, the recesses 120 in the interposer substrate 110 provide an inherent alignment aspect absent in a conventional flip chip semiconductor device assembly because the conductive bumps 156 easily slide into their respective corresponding recesses 120 to ensure proper alignment and proper attachment thereof. In addition, the adhesive element 116 on the first surface 112 of the interposer substrate 10 as well as the conductive paste 182 in the recesses 120 may act as a height controller for reliable attachment of the semiconductor die 150 to the interposer substrate 110, wherein the adhesive element 116 and/or the conductive paste 182 may be used to compensate for any irregularities due to varied conductive bump sizes, recess depths and planarity variation in the surfaces of the interposer substrate 110 and semiconductor die 150.

Figure 10:
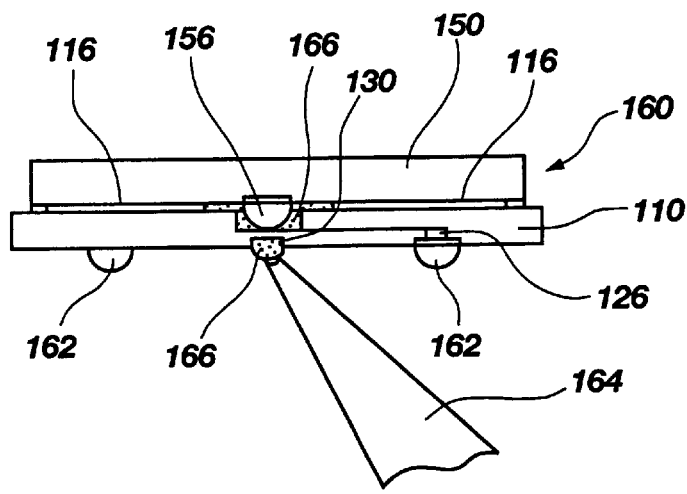
FIG. 10 illustrates dispensing filler material through an opening in an interposer substrate in a flip chip semiconductor device assembly according to the present invention to fill recesses therein.

As shown in FIG. 10, a dielectric filler material 166 (commonly termed an "underfill" material) may be optionally applied through opening 130. The method employed to apply the dielectric filler material 166 preferably involves dispensing under pressure from dispenser head 164, but may include any method known in the art, such as gravity and vacuum injecting. In this manner, the dielectric filler material 166 may be applied into the opening 130, move as a flow front through the multiple segments 132 and into each of the recesses 120 to fill a space around the conductive bumps 156, bond pads 158 and conductive pads or terminals 122. The dielectric filler material 166 may be self-curing through a chemical reaction, or a cure accelerated by heat, ultraviolet light or other radiation, or other suitable means may be used in order to form at least a semisolid mass in the recesses 120. Such dielectric filler material 166 provides enhanced securement of the components of flip chip semiconductor device assembly 160 as well as precluding shorting between conductive elements and protecting the conductive elements from environmental concerns, such as moisture. As such, compared to the conventional underfilling of the entire semiconductor die, the semiconductor device assembly 160 of the present invention requires less time since the filler material may only be directed to fill the recesses 120 or, rather, any leftover space within the recesses 120 proximate the interconnections, i.e., conductive bumps 156.

Turning back to the third and fourth methods depicted in FIGS. 8A–8D and 9A–9B, the interposer substrate 110 described for use in such methods may not include an opening for applying filler material to the recesses 120 because the recesses 120 are substantially filled with conductive paste 182. Therefore, it is contemplated that applying filler material through an opening 130 in the interposer substrate 110 described in the third and fourth methods may not be necessary.

Figure 11:
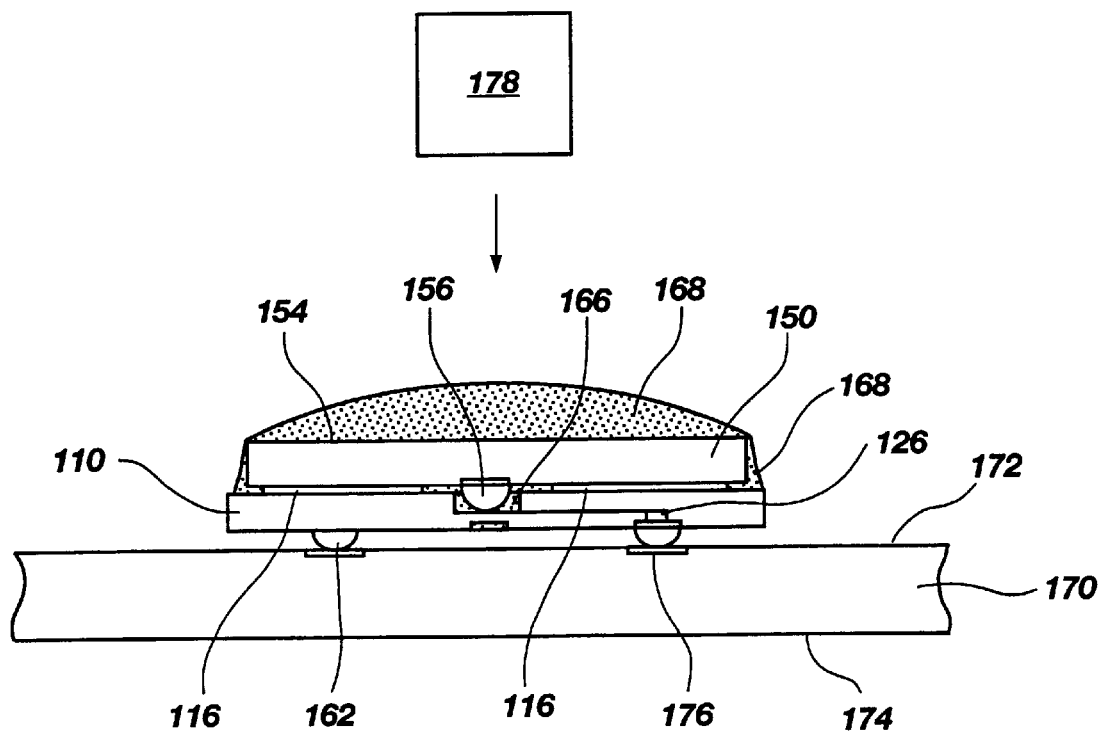
FIG. 11 illustrates encapsulating a semiconductor die in a flip chip semiconductor device assembly and attaching the flip chip semiconductor device assembly according to the present invention to another substrate via solder balls.

FIG. 10 also depicts conductive balls 162, such as solder balls or any suitable conductive material, provided at the conductive pads 126 exposed at the second surface 114 of the interposer substrate 110. Such conductive balls 162 may be provided prior or subsequent to dispensing the dielectric filler material 166, and formation thereof, if formed of solder, is facilitated by solder mask 118 (see FIG. 2) and apertures therethrough placed over locations of conductive pads 126. Of course, conductive balls 162 may comprise other materials, such as conductive epoxies or conductor-filled epoxies, and may comprise other shapes, such as bumps, columns and pillars. Once the conductive balls 162 are formed on or attached to the interposer substrate 110 and the dielectric filler material 166 has been provided (if desired or necessitated), the semiconductor die 150 may then be either partially or fully encapsulated by an encapsulation apparatus 178 with a dielectric encapsulation material 168 as depicted in FIG. 11. In the case of partially encapsulating the semiconductor die 150, encapsulation material 168 may be dispensed by dispenser head 164 about the periphery of the semiconductor die 150 so that the back side or surface 154 of the die is left exposed. In the case of fully encapsulating the semiconductor die 150, encapsulation material 168 may be provided by dispensing, spin-coating, glob-topping, pot molding, transfer molding, or any suitable method known in the art. It is currently preferred that such encapsulation material 168 be applied to the back side or surface 154 of the semiconductor die 150 (which may include applying at the wafer level, as by spin-coating) prior to dispensing additional encapsulation material 168 about the periphery of the semiconductor die 150 in order to facilitate fully encapsulating the semiconductor die 150.

FIG. 11 also depicts flip chip semiconductor device assembly 160 attached to another carrier substrate 170, such as a printed circuit board or mother board. The carrier substrate 170 includes a substrate upper surface 172 and a substrate lower surface 174, upper surface 172 bearing substrate terminal pads 176 arranged to correspond and attach with conductive balls 162 on the second surface 114 of interposer substrate 110. As such, the flip chip semiconductor device assembly 160 may be mechanically and electrically connected to carrier substrate 170 by reflowing the conductive (solder) balls 162 to the substrate terminal pads 176. A dielectric filler material (not shown) as known in the art may then be applied between the flip chip semiconductor device assembly 160 and the carrier substrate 170 for securing and protecting the interconnections, i.e., conductive balls 162, therebetween.

Figure 12:
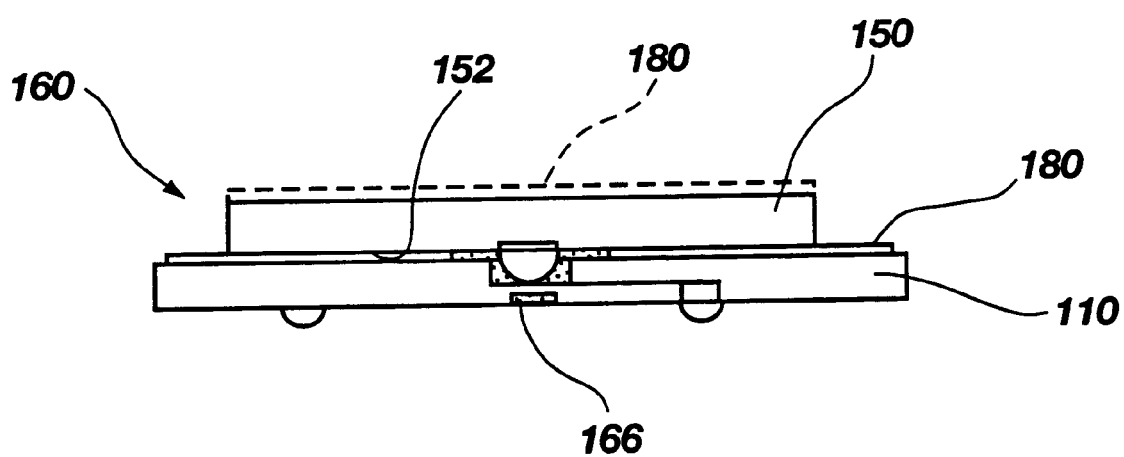
FIG. 12 illustrates a cross-sectional side view of a flip chip semiconductor device assembly including a heat transfer element according to the present invention.

FIG. 12 depicts a flip chip semiconductor device assembly 160 including a heat transfer element 180. The heat transfer element 180 may be provided over the first surface 112 of the interposer substrate 110 and under the adhesive element 116 (not shown) as a thin, thermally conductive material. The heat transfer element 180 may also be provided on the active surface 152 of the semiconductor die 150 to abut the first surface 112 of the interposer substrate 110. Another option is to provide the heat transfer element 180 on the back side or surface 154 of the semiconductor die 150 as shown in broken lines. Such heat transfer element 180 is configured and located to thermally conduct heat generated from the electrical components of the semiconductor die 150 and to remove such heat from the flip chip semiconductor device assembly 160 and to reduce the incidence of thermal fatigue in the interconnections and circuitry of the semiconductor device assembly 160 and, specifically, the semiconductor die 150 as well as to reduce operating temperatures.

The heat transfer element 180 may be formed of any thermally conductive material, such as copper and silver, but may also comprise a thermally conductive material that is nonelectrically conductive, such as a thin diamond material and/or diamond composite deposited as a thin film or layer.

Figure 13:
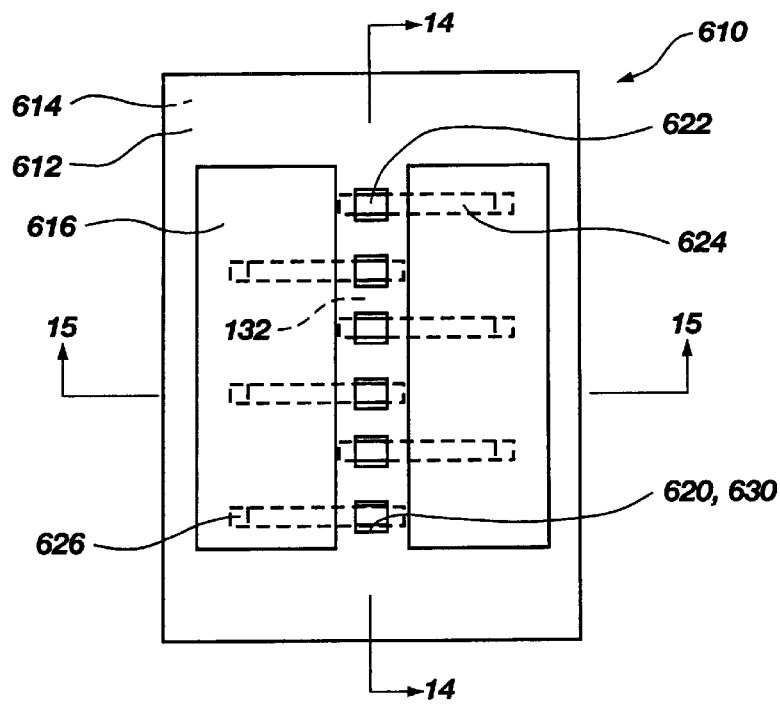
FIG. 13 is a simplified top view of a second embodiment of an interposer substrate having recesses therein in a center pad configuration, according to the present invention.
Figure 14:
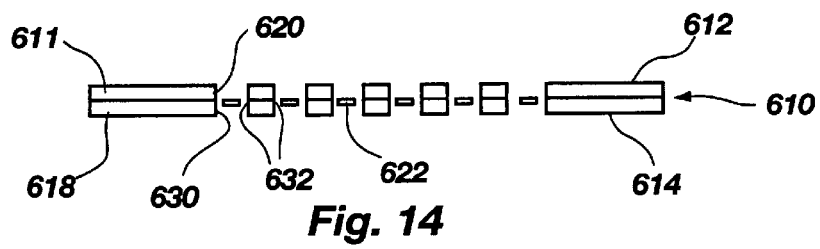
FIG. 14 is a simplified cross-sectional side view taken along line 14—14 in FIG. 13, illustrating passages between multiple openings and respective recesses in an interposer substrate, according to the present invention.

FIG. 13 depicts a top plan view of a second embodiment of an interposer substrate 610 having a center recess configuration. The second embodiment is similar to the first embodiment in most respects, except the interposer substrate 610 of the second embodiment includes multiple openings 630 through dielectric layer 611 (FIG. 14). As in the first embodiment, interposer substrate 610 includes a first surface 612 and a second surface 614, wherein the first surface 612 includes multiple recesses 620 therein and bears one or more adhesive elements 616.

Figure 15:
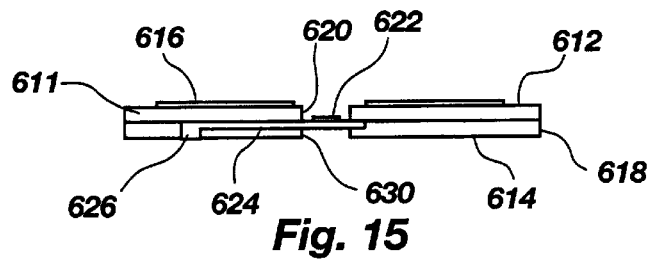
FIG. 15 is a simplified cross-sectional side view take along line 15—15 in FIG. 13, illustrating the adhesive element on the interposer substrate and the conductive elements of the interposer substrate, according to the present invention.

FIGS. 14 and 15 depict cross-sectional views of interposer substrate 610 taken along respective section lines 14 and 15 in FIG. 13, illustrating the multiple openings 630 formed in the solder mask 618 aligned with second surface 614 of interposer substrate 610 and each of the openings 630 extending to a corresponding one of the multiple recesses 620. Each opening 630 and recess 620 extends to a conductive element such as a conductive trace 624 or conductive pad or terminal 622 with one or more passages 632 comprising gaps between a conductive pad or terminal 622 or conductive trace 624 providing communication between each opening 630 and recess 620. In particular, the one or more passages 632 may extend from an upper portion of each opening 630 to a bottom portion of each recess 620 in the interposer substrate 610. The conductive traces 624 or conductive pads or terminals 622 as shown in FIG. 13 are suspended and extend across an upper portion of each opening 630 and a lower portion of each recess 620, of which each conductive trace 624 may extend to another portion of the interposer substrate 610 to conductive pads 626 for electrical interconnection on second surface 614 of interposer substrate 610. Such conductive pads 626 may be located substantially directly below conductive pads or terminals 622 or routed laterally across interposer substrate 610 to various predetermined locations by the conductive traces 624. Solder mask 618 also includes apertures therethrough at the locations of conductive pads 626 on which discrete conductive elements in the form of solder balls may be formed for external electrical connection of interposer substrate 610.

Figure 16:
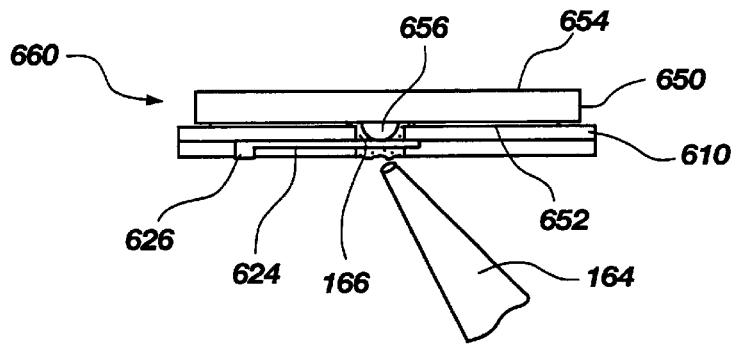
FIG. 16 illustrates a semiconductor die mounted face down to an interposer substrate of the second embodiment in a flip chip-type semiconductor device assembly and dispensing filler material through an opening in the interposer substrate to fill recesses therein, according to the present invention.

FIG. 16 depicts the interposer substrate 610 of the second embodiment mounted and bonded to a semiconductor die 650 having conductive bumps 656 on an active surface 652 thereof to provide a flip chip semiconductor device assembly 660. In previous embodiments, the conductive bumps 656 are arranged in a mirror image of the recess configuration in the interposer substrate 610 so that the semiconductor die 650 and interposer substrate 610 are attached with the conductive bumps 656 disposed in each of the recesses 620 and the conductive bumps 656 electrically connected to the conductive pads or terminals 622 or trace ends either directly or via a conductive solder paste or other nonsolid conductive material. With the openings 630 of the second embodiment each having one or more passages 632 leading to each respective recess 620, the one or more passages 632 allow dielectric filler material 166 to flow therethrough into each of the recesses 620 from a dispenser head 164 positioned proximate and facing each of the openings 630. Dispenser head 164 may introduce dielectric filler material 166 under pressure into openings 630 to be extruded through passages 632 into recesses 620 adjacent conductive bumps 656.

Figure 17:
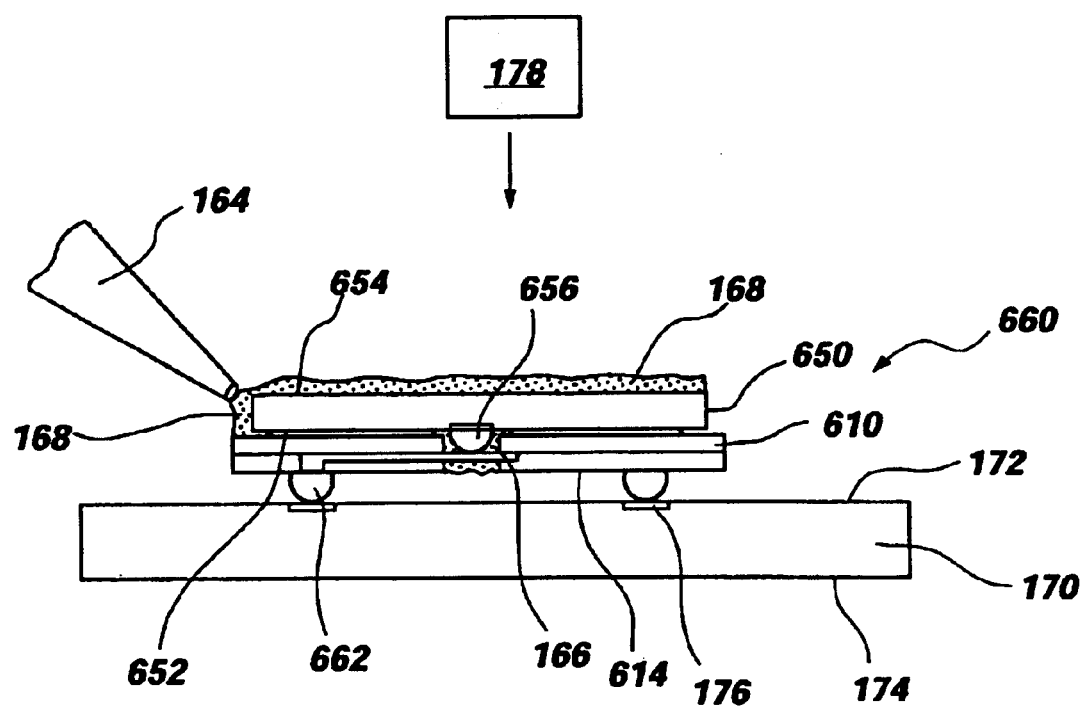
FIG. 17 illustrates encapsulating a semiconductor die in a flip chip-type assembly and the flip chip-type assembly attached to another carrier substrate via solder balls, according to the present invention.

As in the first embodiment, the semiconductor die 650 in the flip chip semiconductor device assembly 660 of the second embodiment may then be either fully encapsulated or partially encapsulated by encapsulation apparatus 178 with an encapsulation material 168 as depicted in FIG. 17. In the case of partially encapsulating the semiconductor die 650, encapsulation material 168 may be dispensed by dispenser head 164 about the periphery of the semiconductor die 650 so that the back surface 654 of the die is left exposed. In the case of fully encapsulating the die, encapsulation material 168 may be applied to the back surface 654 of the semiconductor die 650 (which may include at the wafer level) prior to dispensing encapsulation material 168 about the periphery of the semiconductor die 650 in order to facilitate fully encapsulating the semiconductor die 650.

FIG. 17 also depicts semiconductor device assembly 660 attached to another substrate 170, such as a printed circuit board or mother board. The substrate 170 includes a substrate upper surface 172 and a substrate lower surface 174 with substrate terminal pads 176 made to correspond and attach with conductive balls 662, such as solder balls, on the second surface 614 of interposer substrate 610. Conductive balls 662, if solder, may be formed by placement of solder paste on conductive pads 626 followed by reflow, preformed and secured to conductive pads 626, applied to substrate terminal pads 176, or otherwise as known in the art. As such, the semiconductor device assembly 660 may be bonded to substrate 170 by reflowing the conductive balls 662 to the substrate terminal pads 176. A dielectric filler material (not shown) may then be applied between the semiconductor device assembly 660 and the substrate 170 for securing and protecting the interconnections, i.e., conductive balls 662, therebetween.

Figure 18:
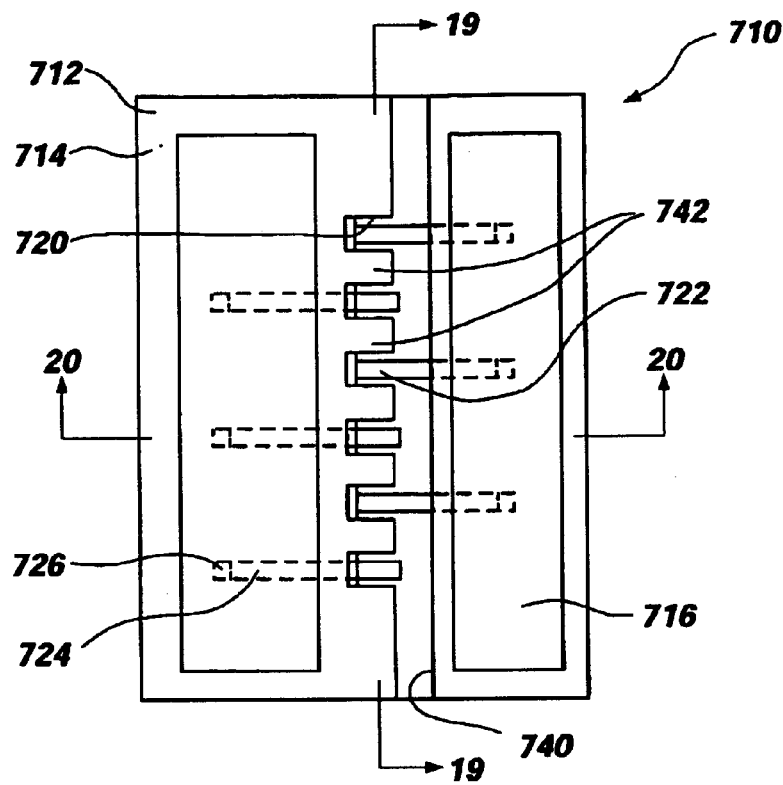
FIG. 18 is a simplified top view of a third embodiment of an interposer substrate having a channel and recesses therein in a center pad configuration, according to the present invention.
Figure 19:
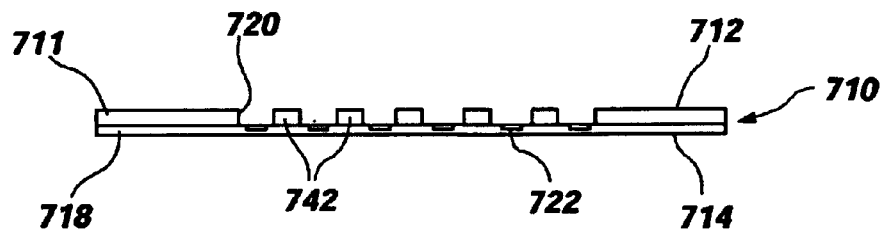
FIG. 19 is a simplified cross-sectional side view taken along line 19—19 in FIG. 18, illustrating fingers and recesses in an interposer substrate, according to the present invention.
Figure 20:
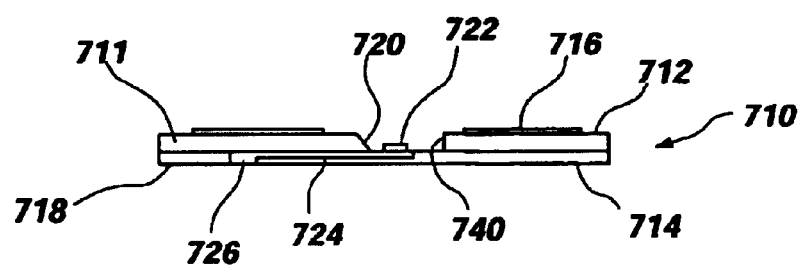
FIG. 20 is a simplified cross-sectional side view take along line 20—20 in FIG. 18, illustrating the channel adjacent a recess in the interposer substrate, according to the present invention.

FIG. 18 depicts a top plan view of a third embodiment of an interposer substrate 710 having a center recess configuration. The interposer substrate 710 of the third embodiment is similar to the first embodiment, except the interposer substrate 710 of the third embodiment does not include openings extending to recesses 720 at a second surface 714 of interposer substrate 710. First surface 712 carries one or more adhesive elements 716 thereon. Second surface 714 carries a plurality of conductive elements in the form of conductive pads or terminals 722 and conductive traces 724 which may have associated therewith conductive pads 726 for formation of discrete conductive elements thereon for connecting interposer substrate 710 to external circuitry. Solder mask 718 (FIG. 19) may be employed to dam the bottoms of recesses 720 as well as the bottom of channel 740. Alternatively, channel 740 may be of lesser depth than recesses 720 and not extend all the way through dielectric layer 711. FIGS. 18-20 depict a channel 740 formed in a first surface 712 of interposer substrate 710, wherein FIGS. 19 and 20 depict cross-sectional views of interposer substrate 710 taken along respective section lines 19 and 20 in FIG. 18. The channel 740 may, but is not limited to, extend to a depth substantially the same as the recesses 720 and is configured to extend longitudinally alongside the row of recesses 720 so that each recess 720 may directly communicate with the channel 740. A portion of the interposer substrate 710 between each recess 720 comprises alignment fingers 742, which are defined by forming the recesses 720 and the channel 740 therealong in interposer substrate 710. Such alignment fingers 742 provide an alignment characteristic so that the conductive bumps may be positioned and aligned with the conductive pads or terminals 722 when being disposed in the recesses 720.

Figure 21:
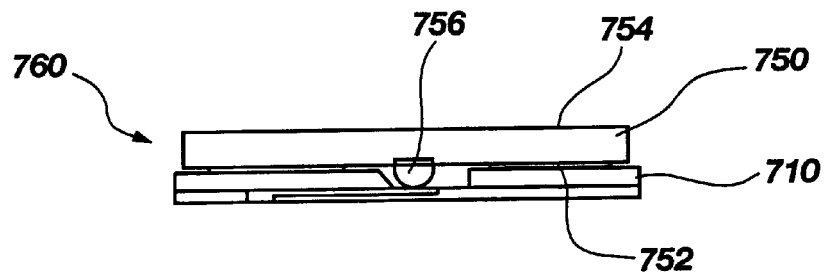
FIG. 21 illustrates a semiconductor die mounted face down to an interposer substrate of the third embodiment in a flip chip-type semiconductor assembly, according to the present invention.

As depicted in FIG. 21, a semiconductor die 750 may be mounted and bonded to interposer substrate 710 so that the active surface 752 of the semiconductor die 750 abuts with the first surface 712 of the interposer substrate 710 and the conductive bumps 756 are disposed in the recesses 720 to form a semiconductor assembly 760, as described in the previous embodiments.

Figure 22:
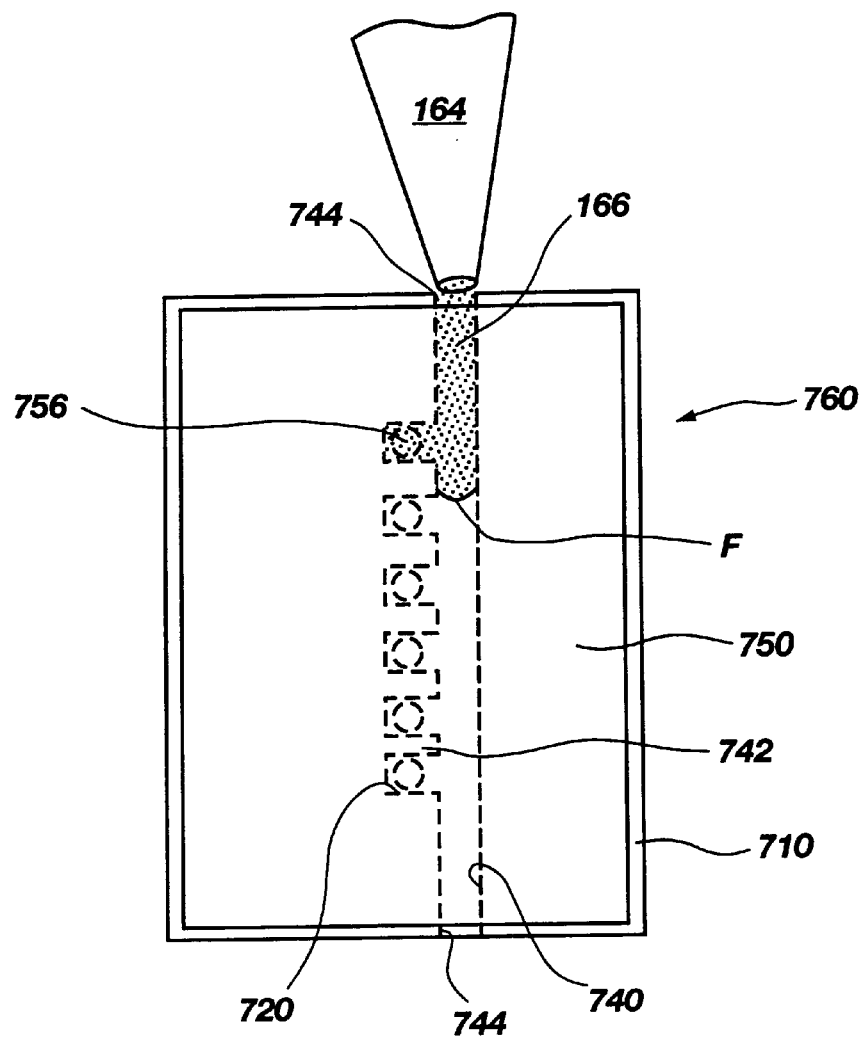
FIG. 22 illustrates a simplified top view of an interposer substrate of a third embodiment mounted to a semiconductor die in a flip chip-type assembly and depicts dispensing filler material through an end of the channel formed in the interposer substrate to fill recesses therein, according to the present invention.

FIG. 22 depicts the channel 740 having a channel opening 744 at a side periphery of the semiconductor assembly 760, through which dielectric filler material 166 may be introduced. Such filler material 166 may be dispensed from dispenser head 164 proximate the channel opening 744, wherein dielectric filler material 166 may flow and fill in spaces around the conductive bumps 756 in the recesses 720. Such process may be employed with the semiconductor assembly 760 horizontal, vertical, or at any angle which may promote the filler material to fill the recesses 720. The dielectric filler material 166 introduction may also be enhanced by a vacuum or suction means to optimize the time it takes to fill in the recesses 720. Further, if conductive pads or terminals 722 cover the bottoms of recesses 720, each conductive pad or terminal may be provided with a hole therethrough through which air may be expelled by the flow front F of dielectric filler material 166 or to which a vacuum may be applied. As in the previous embodiments, semiconductor die 750 may be fully encapsulated, including back side 754, with encapsulation apparatus 178 and dispenser head 164 or partially encapsulated with dispenser head 164, as depicted in FIG. 23.

Figure 23:
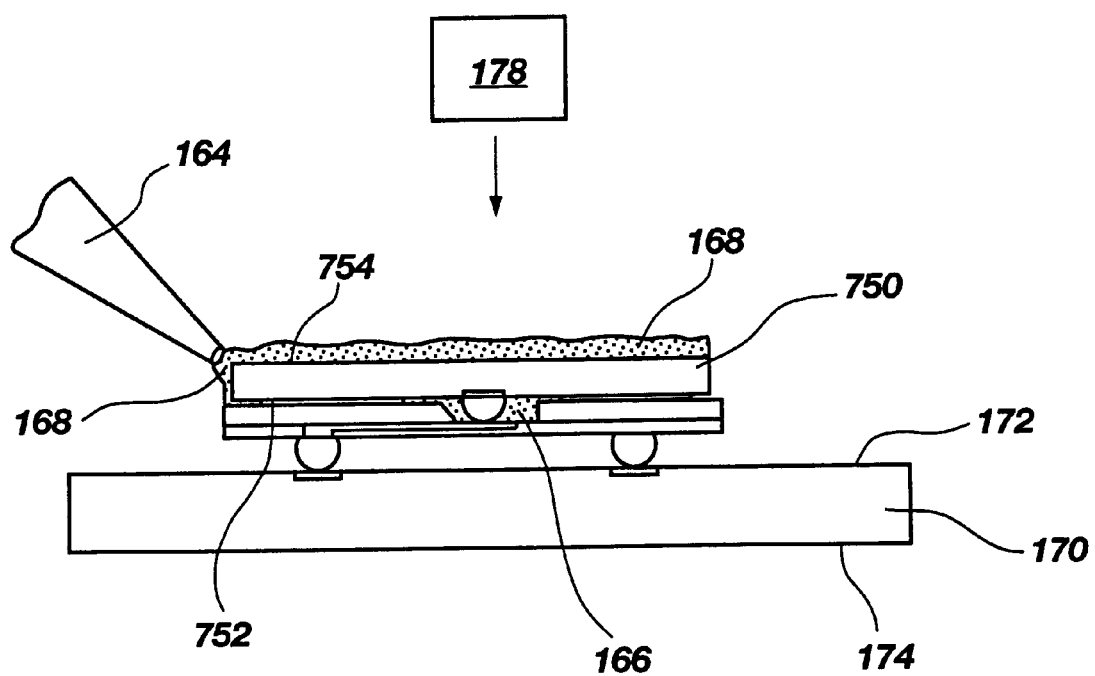
FIG. 23 illustrates encapsulating a semiconductor die in a flip chip-type assembly and the flip chip-type semiconductor assembly attached to another substrate via solder balls, according to the present invention.

FIG. 23 also depicts semiconductor assembly 760 attached to another substrate 170, such as a printed circuit board or mother board. The substrate 170 includes a substrate upper surface 172 and a substrate lower surface 174 with substrate terminal pads 176 made to correspond and attach with conductive balls 762, such as solder balls, on the second surface 714 of interposer substrate 710. As such, the semiconductor assembly 760 may be bonded to substrate 170 by reflowing the conductive balls 762 to the substrate terminal pads 176. A filler material (not shown) may then be applied between the semiconductor assembly 760 and the substrate 170 for securing and protecting the interconnections, i.e., conductive balls 762, therebetween.

Figure 24A:
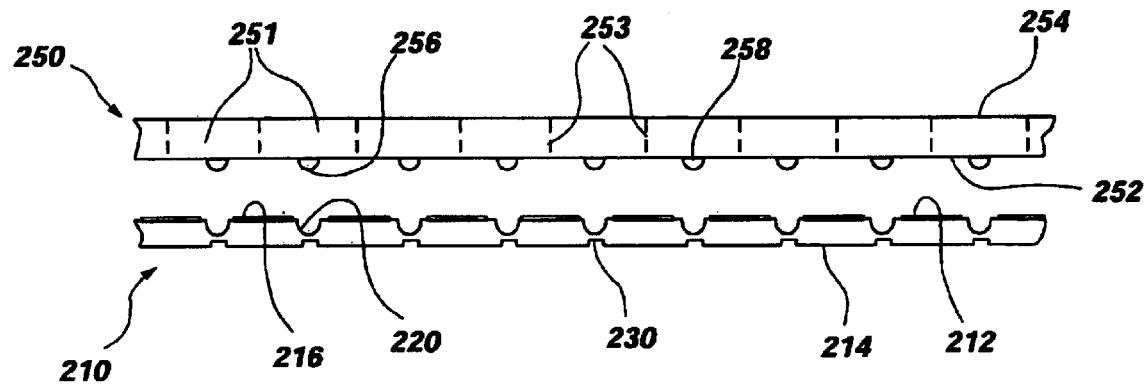
Figure 24B:
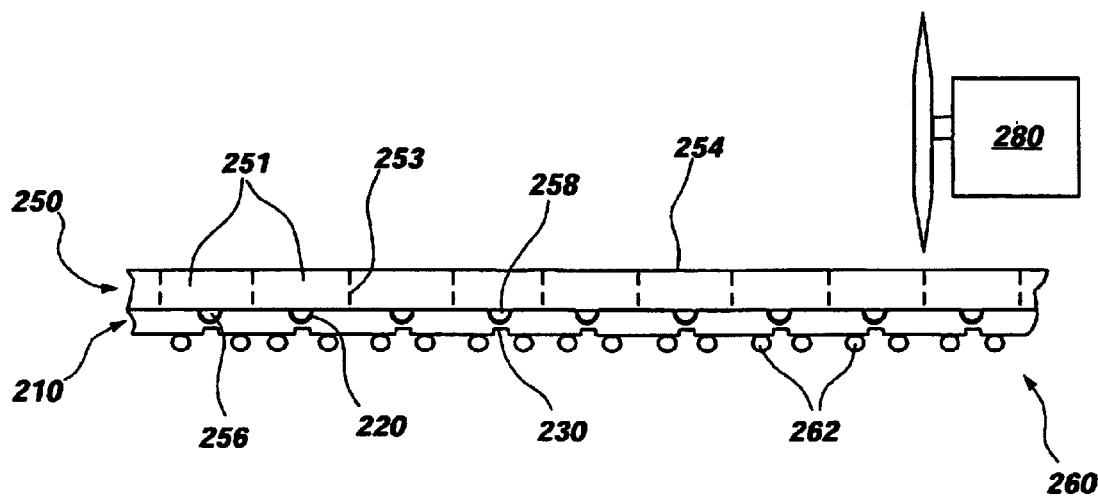

As depicted in FIGS. 24A and 24B, the interposer substrate 110 of the present invention may also be formed initially on a wafer scale corresponding to a semiconductor wafer carrying a plurality of unsingulated semiconductor dice 150 and then singulated or separated after assembly by a dicing process into the individual flip chip semiconductor device assemblies 160. As used herein, the term "wafer" is not limited to conventional substantially circular semiconductor wafers but extends to any large-scale substrate including a layer of semiconductor material of sufficient size for formation of multiple dice thereon and encompasses portions of such large-scale substrates bearing multiple semiconductor dice. In particular, FIG. 24A depicts a simplified cross-sectional view of a semiconductor wafer 250 facing a wafer scale interposer substrate 210 prior to mutual attachment thereof. The semiconductor wafer 250 collectively includes multiple semiconductor dice 251 in columns and rows separable along borders 253 as shown in broken lines, wherein the semiconductor wafer 250 includes a back side or surface 254 and an active surface 252 and each semiconductor die 251 includes conductive bumps 256 in a configuration dictated by the bond pads 258 on which they are formed.

The interposer substrate 210 includes a first surface 212 and a second surface 214 with multiple recesses 220 formed in the first surface 212 and openings 230 having passages (not shown) formed in the second surface 214. The recesses 220 formed in the interposer substrate 210 are made to correspond in substantially a mirror image with the bump configuration on each of the semiconductor dice 251 of the semiconductor wafer 250. In this manner, the interposer substrate 210 may be attached to the semiconductor wafer 250 via an adhesive element 216 on the first surface 212 of the interposer substrate 210 so that the conductive bumps 256 on the semiconductor wafer 250 are inserted into and substantially received within the multiple recesses 220 formed in the interposer substrate 210 to form a wafer scale assembly 260, as depicted in FIG. 24B. The wafer scale assembly 260 may then be singulated or "diced" along the borders 253 of the semiconductor wafer 250 via a dicing member such as a wafer saw 280 to form individual, singulated flip chip semiconductor device assemblies that each include one or more semiconductor dice 251 having the separated interposer substrate 210 of the present invention mounted thereon.

Also at the wafer level and as previously described in association with FIGS. 6A-6B, 7A-7B, 8A-8D, 9A-9B, the conductive bumps 256 may be bonded to the conductive pads or terminals in the recesses 220 to, therefore, mechanically bond and electrically connect the semiconductor wafer 250 to the wafer scale interposer substrate 210. In addition, dielectric filler material may be applied through the openings 230 and conductive balls 262 may be provided on the bond posts on the second surface 214 of the interposer substrate 210, either prior to dicing the wafer scale assembly 260, or subsequent thereto.

Figure 25:
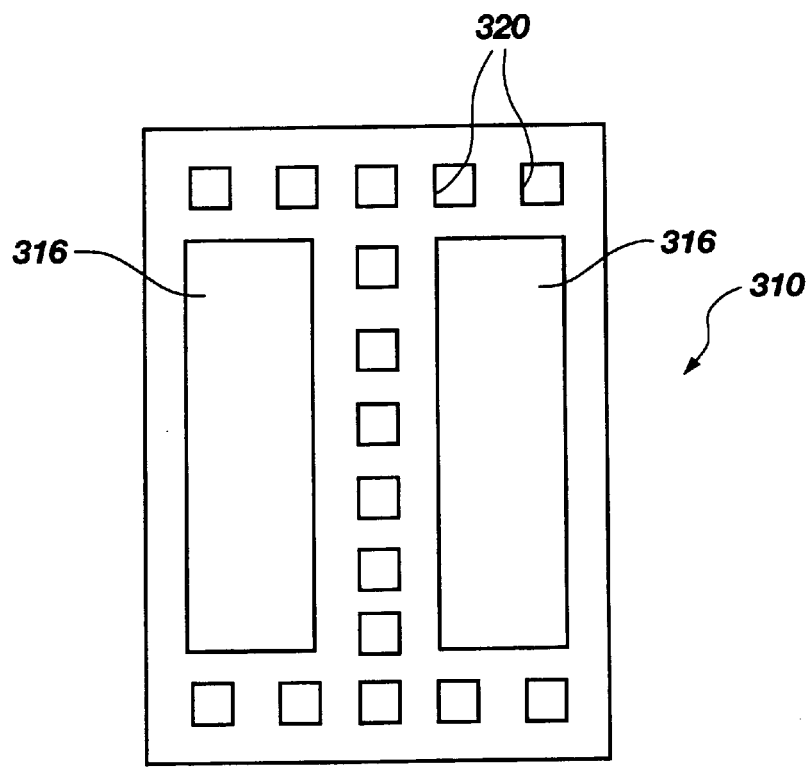
FIG. 25 illustrates a simplified top view of a first alternative interposer substrate having recesses therein in an I-shaped configuration, according to the present invention.
Figure 26:
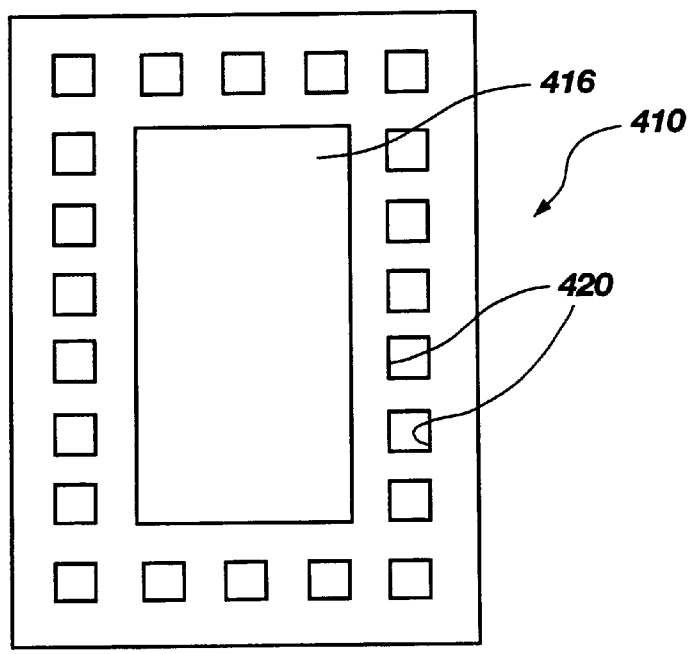
FIG. 26 illustrates a simplified top view of a second alternative interposer substrate having recesses therein in a peripheral configuration, according to the present invention.

FIG. 25 depicts a top plan view of an interposer substrate 310 having an alternative recess configuration made for corresponding to a substantially "mirror image" bond pad configuration on the active surface of a semiconductor die. In particular, in this first alternative, there is an I-shaped bond pad configuration, wherein multiple recesses 320 are formed over the upper surface 312 of interposer substrate 310 that are aligned in the shape of an "I" with adhesive elements 316 disposed on either side of the body of the "I" and between the ends thereof. In another alternative recess configuration, the recesses may be formed in an interposer substrate around a periphery thereof. Such alternative is depicted in FIG. 26 of a top plan view of an interposer substrate 410 with an adhesive element 416 at a center portion of interposer substrate 410 and recesses 420 formed thereabout and proximate a periphery of interposer substrate 410. As in the previous recess configurations, the periphery recess configuration in interposer substrate 410 is made to correspond with a substantially "mirror image" bond pad configuration on an active surface of a semiconductor die.

As previously described with respect to the center row recess configuration, both the I-shaped and the periphery configurations depicted in FIGS. 25 and 26 may include one or more openings in a surface of the interposer substrate opposing that through which the recesses are formed with passages extending therefrom to each of the recesses. As such, subsequent to mounting a bumped semiconductor die to the interposer substrate, dielectric filler material may be applied through the opening and passages to fill the recesses and protect the conductive bumps disposed therein.

Figure 27:
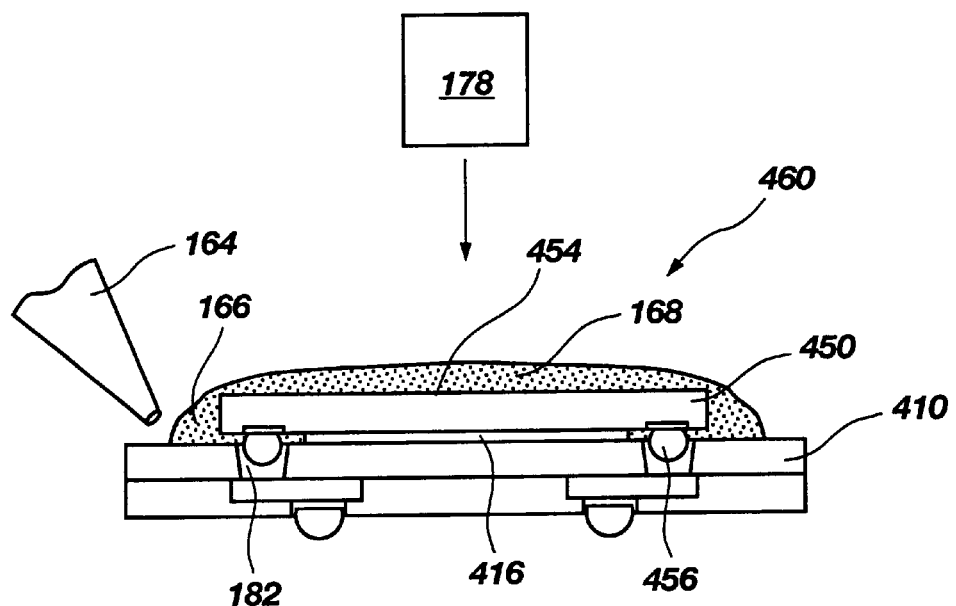
FIG. 27 illustrates underfilling and encapsulating a flip chip-type semiconductor device assembly having the second alternative interposer substrate design, according to the present invention.

FIG. 27 depicts a cross-sectional view of a semiconductor assembly 460 including a semiconductor die 450 mounted face down to an interposer substrate 410 having a peripheral recess configuration and an alternative method of applying dielectric filler material 166 to the semiconductor assembly 460. In particular, dielectric filler material 166 may be applied by dispenser head 164 around the periphery of the semiconductor die 450 so that the dielectric filler material 166 flows under the semiconductor die 450 and around the conductive bumps 456 adjacent the die periphery. As such, the dielectric filler material 166 is only needed proximate the conductive bumps 456 and not under the entire die as done conventionally. The semiconductor die 450 may be left exposed or encapsulated by encapsulation apparatus 178, which may provide encapsulation material 168 to the semiconductor assembly 460 via dispensing, spin-coating, globtopping, depositing, transfer molding, or any other suitable method known in the art. It is preferred that such encapsulation material 168 be applied to the back surface 454 of the semiconductor die 450 at the wafer level or prior to dispensing the dielectric filler material 166 about the periphery to facilitate fully encapsulating the semiconductor die 450.

Further, in this alternative embodiment, it is preferred that the semiconductor die 450 is assembled and bonded to the interposer substrate 410 with the conductive bumps 456 disposed in the conductive paste 182 as described in FIGS. 8A-8D and 9A-9B; however, this alternative may also employ the methods described in FIGS. 6A-6B and 7A-7B for assembling and bonding the semiconductor die 450 to the interposer substrate 410.

Figure 28:
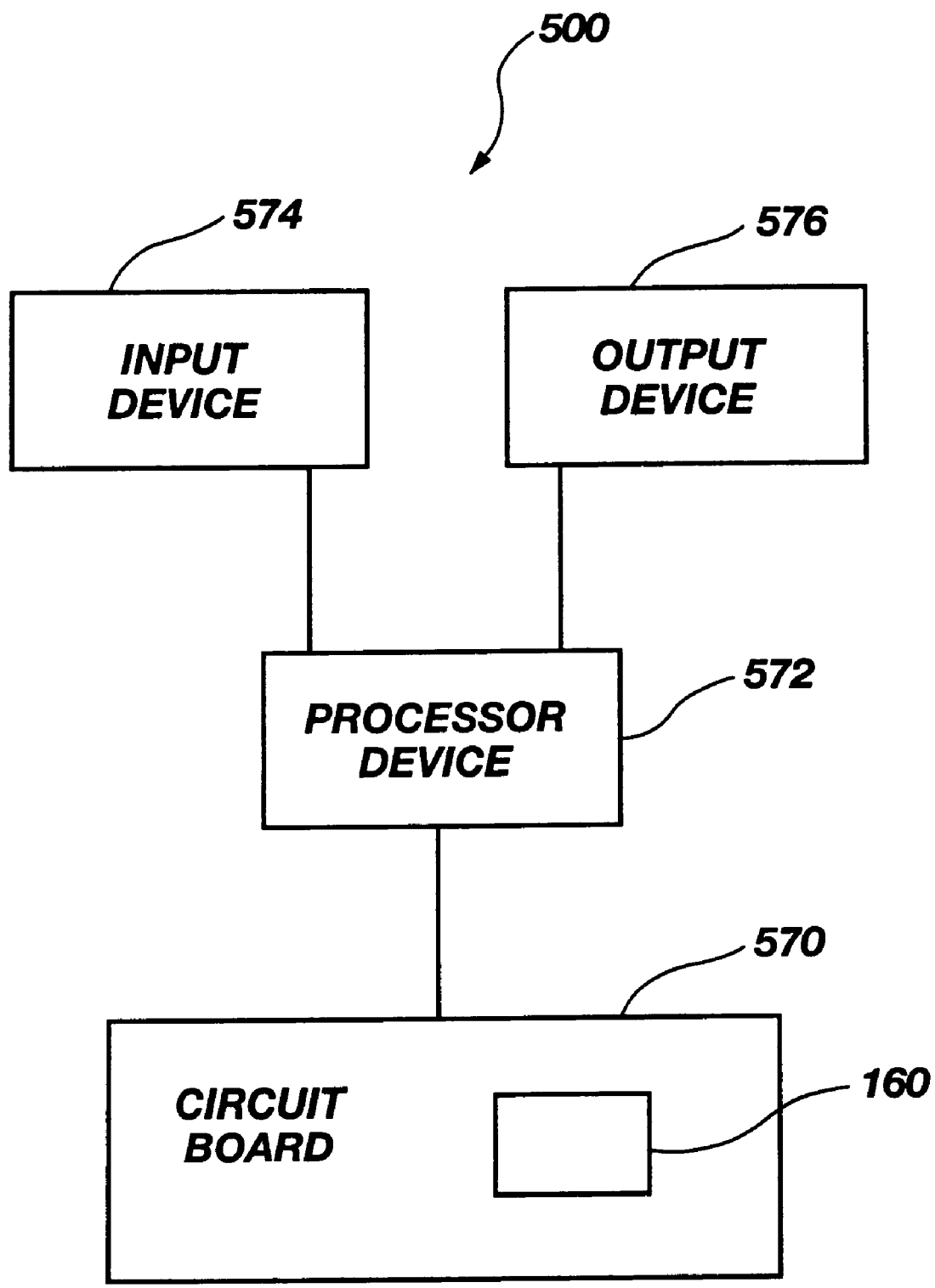
FIG. 28 is a simplified block diagram of the flip chip-type semiconductor assembly of the present invention integrated in a computer system.

As illustrated in block diagram form in drawing FIG. 28, flip chip semiconductor device assembly 160 of the present invention is mounted to a circuit board 570, such as previously discussed carrier substrate 170, in a computer system 500. In the computer system 500, the circuit board 570 is connected to a processor device 572 which communicates with an input device 574 and an output device 576. The input device 574 may be a keyboard, mouse, joystick or any other computer input device. The output device 576 may be a monitor, printer or storage device, such as a disk drive, or any other output device. The processor device 572 may be, but is not limited to, a microprocessor or a circuit card including hardware for processing computer instructions. Additional structure for the computer system 500 is readily apparent to those of ordinary skill in the art.

Figure 29:
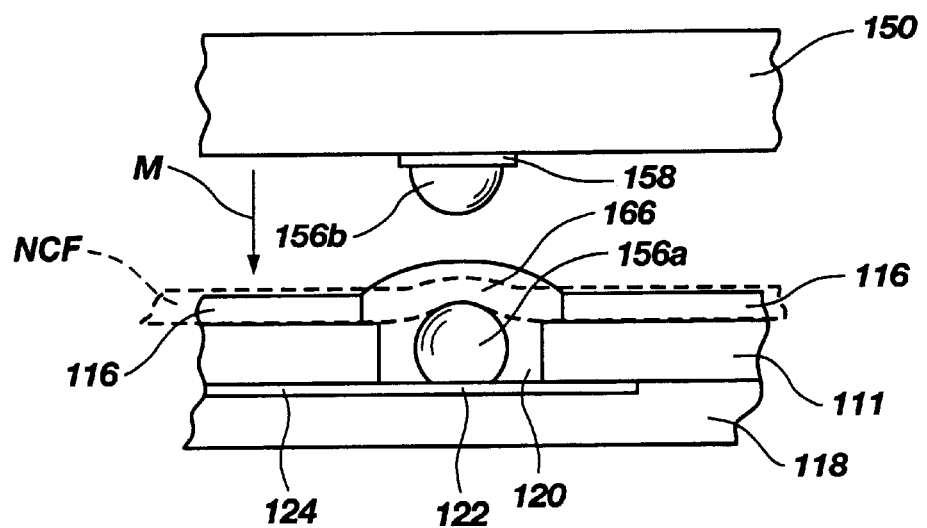
FIG. 29 depicts an approach to implementation of the present invention using a nonflow dielectric filler material placement.

As a further approach to implementing the present invention, and as depicted in FIG. 29, an interposer substrate 10 may be provided having conductive traces 124 laminated thereto, the bottoms thereof being fully covered or, optionally, uncovered by solder mask 118, and a conductive bump 156a formed by reflow (if solder) or curing (if an epoxy) of a mass of conductive paste 182 at the bottom of each recess 120. A dielectric filler material 166 is then disposed over conductive bumps 156a in each recess 120 as shown. A semiconductor die 150 carrying a like plurality of conductive bumps 156b arranged for superimposed contact with conductive bumps 156a when semiconductor die 150 is aligned with interposer substrate 110 is then aligned over interposer substrate 110 and vertically pressed thereagainst as depicted by arrow M, the die placement motion squeezing the nondielectric filler material laterally outward so that conductive bumps 156a and 156b meet and make conductive contact. Adhesive elements 116 may, as shown, be used, or may be omitted, as desired.

In a variation of the approach of FIG. 29, it is also contemplated that, in lieu of using dielectric filler material 166 and to provide an interposer substrate-to-die adhesive instead of using a separate adhesive element 116, a nonconductive film NCF, as shown in broken lines in FIG. 29 may be disposed over interposer substrate 110 after formation of conductive bumps 156a thereon and prior to assembly with a semiconductor die 150 carrying conductive bumps 156b. When the semiconductor die 150 and interposer substrate 110 are pressed together, conductive bumps 156a and 156b will penetrate the nonconductive film to initiate mutual electrical contact therebetween. Suitable nonconductive films include the UF511 and UF527 films offered by Hitachi Chemical, Semiconductor Material Division, Japan.

Thus, it will be apparent that the flip chip semiconductor device assembly of the present invention provides a compact, robust package at a reduced cost in comparison to conventional bumped semiconductor die assemblies employing dual conductive layer interposers. For example, a package height reduction of about 90 $\mu$m may be effected using a 100 $\mu$m thick dielectric member and eliminating a second 12 $\mu$m thick conductive layer adjacent the semiconductor die, even with a 25 $\mu$m thick adhesive element comprising a tape disposed between the semiconductor die and the interposer substrate, since the discrete conductive elements or conductive bumps of the die may be substantially completely received within the recesses of the dielectric member, but for any vertical standoff provided by the tape. Electrical connection reliability is improved, since the conductive bumps are in contact with the terminals at the recess bottoms, either directly or through an interposed conductive material within the recesses, eliminating the need for conductive vias and an electrical connection between a first conductive layer adjacent the semiconductor die contacted by a conductive bump and a via and another electrical connection between the via and a second conductive layer on the opposite side of the interposer substrate. Moreover, due to the straightforward design, even large semiconductor dice carrying a large number of conductive bumps may be rerouted for external connection using the present invention as all rerouting is carried out on the side of the interposer substrate facing away from the semiconductor die.

The present invention may employ a recess lateral dimension or diameter which is far in excess of the lateral dimension or diameter of an associated conductive bump, thus greatly facilitating bump and recess alignment by loosening required dimensional tolerances. For example, a 75 $\mu$m bump may be employed with a 120 $\mu$m recess using a 175 $\mu$m pitch.

It is anticipated, as previously noted, that various types of conductive bumping may be used to implement the present invention. However, it is currently believed that gold stud bumps used in combination with a solder paste disposed in the recesses are particularly suitable for prototyping and low volume production due to their advanced state of development, low cost, flexibility in accommodating different bond pad layouts and fine pitch capability.

In addition, the use of a flexible interposer substrate easily accommodates minor variations between heights of various conductive bumps and lack of absolute planarity of the semiconductor die active surface as well as that of the terminals. Further, encapsulation, if desired, of some or all portions of the periphery and back surface of the semiconductor die by a variety of methods is greatly facilitated, as is incorporation of a thermally conductive heat transfer element such as a heat sink without adding complexity to the package. If an adhesive element employing a tape is used to secure the semiconductor die and interposer substrate together, different bond pad arrangements are easily accommodated without the use of a liquid or gel adhesive and attendant complexity of disposition. Further, tape may be used to resolve a lack of coplanarity of the conductive bumps on a semiconductor die or at the wafer level and to provide cushioning during die attach to the interposer substrate, as sufficient force may be applied to ensure contact of the conductive bumps with terminals without damage to the assembly. More specifically, during semiconductor die placement, the tape may act as a stopper or barrier and as a cushion. If a conductive paste is deposited in a via, the tape acts as a barrier to prevent paste contamination of the surface of the semiconductor die. If, on the other hand, solidified conductive bumps are used, when heat is used to soften the bump material, the tape acts as a stopper as well as a cushion when the bump material relaxes. In addition, tape accommodates the "spring back" effect exhibited when force used to assemble a semiconductor die and interposer substrate is released, helping to keep the interconnection or joint together. These advantages are applicable to both rigid or flexible interposer substrates.

Further, use of tape facilitates handling of the assembly prior to reflow of solder-type conductive bumps in the recesses as well as rework, as the assemblies may be electrically tested before reflow and before a dielectric filler is applied and/or the semiconductor die encapsulated and a defective die removed and replaced. The presence of the tape also reduces the volume of dielectric filler material (if employed) required between the interposer substrate and semiconductor die and its compliant characteristics reduce the potential incidence of stress-induced defects due to thermal cycling of the assembly during operation.

While the present invention has been disclosed in terms of certain preferred embodiments and alternatives thereof, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention. For example, the opening 130 and segments 132 described in association with the centrally aligned recess configuration in interposer substrate 110 in FIGS. 1-3, may also be provided and adapted to the I-shaped recess configuration of interposer substrate 310 and the periphery recess configuration of interposer substrate 410 in FIGS. 25 and 26, respectively. In addition, the present invention is contemplated as affording advantages to assemblies using rigid as well as flexible interposer substrates, although, of course, some features and embodiments may offer greater utility to flexible interposer substrates.

What is claimed is:

1. A flip chip semiconductor device assembly comprising:
at least one semiconductor die having an active surface and a back surface, the active surface having a plurality of conductive bumps thereon;
an interposer substrate having a first surface and a second surface, the interposer substrate including a dielectric member having a plurality of recesses extending thereinto from the first surface, each recess of the plurality exposing at least a portion of a conductive element at a bottom thereof, the interposer substrate mounted to the at least one semiconductor die with the plurality of conductive bumps substantially received in the plurality of recesses, the plurality of recesses sized so that a gap is left surrounding at least a portion of at least some of the plurality of conductive bumps in the plurality of recesses, the interposer substrate including at least one opening extending therethrough, the at least one opening being in communication with the gaps; and
a dielectric filler material extending from the at least one opening into the gaps.

2. The assembly of claim 1, wherein the at least one opening comprises a plurality of passages extending to the plurality of recesses.

3. The assembly of claim 2, wherein the plurality of passages comprises one or more passages extending to each of at least some of the plurality of recesses.

4. The assembly of claim 1, wherein the at least one opening comprises a plurality of openings, each extending to a bottom portion of one of the plurality of recesses.

5. The assembly of claim 1, wherein the at least one opening is formed through the second surface of the interposer substrate.

6. The assembly of claim 1, wherein the at least one opening comprises a channel formed in the first surface of the interposer substrate and extending from one portion of a periphery of the interposer substrate to at least an interior portion thereof.

7. The assembly of claim 6, wherein a sidewall of the channel extends beside at least some of the plurality of recesses and opens into the at least some recesses in the interposer substrate.

8. The assembly of claim 6, wherein the channel comprises a channel opening provided at the periphery of the interposer substrate, the channel opening configured to receive the dielectric filler material in nonsolid form.

9. The assembly of claim 6, wherein the channel comprises a portion of the active surface of the at least one semiconductor die as a top wall of the channel.

10. The assembly of claim 1, wherein the active surface of the at least one semiconductor die lies adjacent the first surface of the interposer substrate.

11. The assembly of claim 1, wherein the first surface of the interposer substrate comprises an adhesive element attaching the first surface of the interposer substrate to the active surface of the at least one semiconductor die.

12. The assembly of claim 1, wherein the plurality of recesses comprises a recess configuration which is substantially a mirror image of a bond pad configuration on the active surface of the at least one semiconductor die.

13. The assembly of claim 12, wherein the recess configuration comprises at least one of a center row recess configuration, an I-shaped recess configuration, and a peripheral recess configuration.

14. The assembly of claim 1, further comprising an encapsulation material formed over the at least one semiconductor die to at least partially encapsulate the at least one semiconductor die.

15. The assembly of claim 1, wherein the second surface of the interposer substrate includes conductive balls on at least some of the conductive elements to electrically interconnect to external circuitry.

16. The assembly of claim 1, wherein the dielectric filler material comprises a resin.

17. The assembly of claim 16, wherein the dielectric filler material comprises at least one of a thermoset resin and a thermoplastic resin.

18. The assembly of claim 1, wherein the interposer substrate comprises a flexible dielectric tape.

19. The assembly of claim 1, wherein the interposer substrate comprises at least one of a polymer material, BT, FR4 laminate, FR5 laminate and ceramic.

20. A semiconductor assembly comprising:
a wafer including a plurality of unsingulated semiconductor dice, each of the semiconductor dice having an active surface and a back surface, the active surface of each of the dice having a plurality of conductive bumps thereon;
a wafer scale interposer substrate member comprising a dielectric member and including multiple unsingulated interposer substrates, each arranged and dimensioned to correspond with one of the plurality of semiconductor dice, each of the interposer substrates having a first surface, a second surface, and a plurality of recesses extending thereinto from the first surface, each recess exposing at least a portion of a conductive element at a bottom thereof, the wafer scale interposer substrate member mounted to the wafer with the conductive bumps on each of the semiconductor dice substantially received in the plurality of recesses in the interposer substrates, the plurality of recesses sized so that a gap is left adjacent a portion of at least some of the conductive bumps in the plurality of recesses, each of the interposer substrates including at least one opening in the dielectric member thereof in communication with at least some of the gaps surrounding the at least some conductive bumps in the plurality of recesses; and
a dielectric filler material extending from the at least one opening into the at least some of the gaps.

21. The assembly of claim 20, wherein the at least one opening comprises a plurality of passages extending to the plurality of recesses.

22. The assembly of claim 21, wherein the plurality of passages comprises one or more passages extending to one of the plurality of recesses.

23. The assembly of claim 20, wherein the at least one opening comprises a plurality of openings in each of the interposer substrates, each of the plurality of openings extending to a bottom portion of one of the plurality of recesses.

24. The assembly of claim 20, wherein the at least one opening is formed in the second surface of each of the interposer substrates.

25. The assembly of claim 20, wherein the at least one opening comprises at least one channel formed in the first surface of each of the interposer substrates and extends from a periphery of the wafer scale interposer substrate member to at least an interior portion thereof.

26. The assembly of claim 25, wherein a sidewall of the at least one channel extends beside at least some of the plurality of recesses and opens into the at least some recesses.

27. The assembly of claim 25, wherein the at least one channel comprises at least one channel opening provided at a periphery of the wafer scale interposer substrate member, the at least one channel opening configured to receive the dielectric filler material in nonsolid form.

28. The assembly of claim 25, wherein the at least one channel comprises a portion of an active surface of the wafer as a top wall of the at least one channel.

29. The assembly of claim 20, wherein an active surface of the wafer lies adjacent the first surface of the wafer scale interposer substrate member.

30. The assembly of claim 20, wherein the first surface of the wafer scale interposer substrate member comprises at least one adhesive element on each of the unsingulated semiconductor dice attaching the first surface of the wafer scale interposer substrate member to an active surface of the semiconductor dice.

31. The assembly of claim 20, wherein the plurality of recesses in each of the interposer substrates comprises a recess configuration which is substantially a mirror image of a bond pad configuration on the active surface of each of the semiconductor dice.

32. The assembly of claim 31, wherein the recess configuration comprises at least one of a center row recess configuration, an I-shaped recess configuration, and a peripheral recess configuration.

33. The assembly of claim 20, further comprising an encapsulation material formed over a back surface of the semiconductor dice.

34. The assembly of claim 20, wherein the second surfaces of the interposer substrates include conductive pads with conductive balls attached thereto.

35. The assembly of claim 20, wherein the dielectric filler material comprises a resin.

36. The assembly of claim 20, wherein the dielectric filler material comprises at least one of a thermoset resin and a thermoplastic resin.

37. The assembly of claim 20, wherein the wafer scale interposer substrate member comprises a flexible dielectric tape.

38. The assembly of claim 20, wherein the wafer scale interposer substrate member comprises at least one of a polymer material, BT, FR4 laminate, FR5 laminate and ceramic.

39. A method of assembling a flip chip semiconductor device assembly comprising:
providing a semiconductor die having an active surface and a back surface, the active surface having a plurality of conductive bumps thereon;
providing an interposer substrate having a first surface and a second surface, the interposer substrate having a dielectric member including a plurality of recesses extending thereinto from the first surface and exposing at least a portion of a conductive element at bottoms of the recesses, the interposer substrate including at least one opening in the dielectric member extending therethrough;
mounting the interposer substrate to the semiconductor die with the plurality of conductive bumps substantially received in the plurality of recesses, the plurality of recesses sized so that a gap is left adjacent a portion of at least some of the conductive bumps in at least some of the plurality of recesses, the at least one opening formed in the interposer substrate extending to the gaps adjacent the at least some conductive bumps in the at least some recesses; and
introducing a dielectric filler material in flowable form into the at least one opening in sufficient quantity to extend to at least some of the gaps.

40. The method of claim 39, wherein the providing the interposer substrate comprises forming the at least one opening in the second surface in the interposer substrate to include one or more passages extending to a lower portion of at least some of the plurality of recesses.

41. The method of claim 39, wherein the providing the interposer substrate comprises forming the at least one opening in the second surface in the interposer substrate as a plurality of openings, each of the plurality of openings corresponding to one of the plurality of recesses and extending thereto.

42. The method of claim 40, wherein the introducing comprises applying the dielectric filler material to the at least one opening in the interposer substrate to flow into the at least one opening and through the one or more passages to fill the gaps adjacent the plurality of recesses.

43. The method of claim 41, wherein the introducing comprises applying the dielectric filler material to the plurality of openings in the interposer substrate to flow into each of the plurality of openings and through the one or more passages to substantially fill the gaps.

44. The method of claim 42, wherein the applying the dielectric filler material comprises dispensing the dielectric filler material under pressure.

45. The method of claim 43, wherein the applying the dielectric filler material comprises dispensing the dielectric filler material under pressure.

46. The method of claim 39, wherein the providing the interposer substrate including at least one opening comprises forming a channel in the first surface of the interposer substrate.

47. The method of claim 46, wherein the forming comprises extending the channel from a periphery of the interposer substrate to at least an interior portion of the interposer substrate.

48. The method of claim 47, wherein the extending the channel comprises extending the channel beside at least some of the plurality of recesses so that each of the at least some of the plurality of recesses opens into a portion of the channel.

49. The method of claim 48, wherein the introducing comprises introducing the dielectric filler material into the channel to flow therethrough and into the gaps.

50. The method of claim 49, wherein the introducing the dielectric filler material comprises dispensing the dielectric filler material under pressure.

51. The method of claim 39, wherein the mounting comprises conductively bonding each of the conductive bumps on the semiconductor die to the conductive element at the bottoms of the plurality of recesses.

52. The method of claim 51, wherein the bonding comprises bonding by at least one of reflowing, curing, ultrasonic bonding and thermal compression bonding.

53. The method of claim 39, further comprising disposing a nonsolid conductive material on the conductive bumps prior to the mounting.

54. The method of claim 53, further comprising bonding each of the conductive bumps having the nonsolid conductive material thereon to the conductive element at the bottom of one of the plurality of recesses of the interposer substrate.

55. The method of claim 39, further comprising disposing a nonsolid conductive material in each of the plurality of recesses.

56. The method of claim 55, wherein the disposing the nonsolid conductive material comprises:
providing a stencil having a pattern of apertures therethrough corresponding to a pattern of the plurality of recesses;

positioning the stencil over the interposer substrate so that the pattern of apertures corresponds with said the pattern of the plurality of recesses; and spreading the nonsolid conductive material over the stencil with a spread member to dispose the nonsolid conductive material in each of the plurality of recesses.

57. The method of claim 56, further comprising inserting each of the conductive bumps on the semiconductor die in one of the plurality of recesses in contact with the nonsolid conductive material therein.

58. The method of claim 57, further comprising bonding each of the conductive bumps to a conductive element in one of the recesses using the nonsolid conductive material.

59. The method of claim 39, further comprising forming an encapsulation layer over the back surface of the semiconductor die with an encapsulation material.

60. The method of claim 59, wherein the forming the encapsulation layer comprises depositing the encapsulation layer by at least one of spin-coating and glob-top covering.

61. The method of claim 59, further comprising fully encapsulating the semiconductor die by dispensing encapsulation material about a periphery of the semiconductor die.

62. The method of claim 39, further comprising partially encapsulating the semiconductor die by dispensing encapsulation material about a periphery of the semiconductor die.

63. A method of assembling a flip chip semiconductor device assembly comprising:

providing a semiconductor die having an active surface and a back surface, the active surface having a plurality of conductive bumps thereon;

providing an interposer substrate having a first surface and a second surface, the interposer substrate including a plurality of recesses extending from the first surface thereinto and at least one opening formed in the interposer substrate extending therethrough, the at least one opening extending to at least one of the plurality of recesses;

mounting the active surface of the semiconductor die to the first surface of the interposer substrate so that the conductive bumps are disposed in the plurality of recesses and leave a gap adjacent a portion of at least some of the conductive bumps within at least some of the plurality of recesses; and introducing a flowable material through the at least one opening sufficient to extend to and at least partially fill at least some of the gaps.

64. A method of applying a material to a flip chip semiconductor device assembly, the method comprising:

providing a semiconductor die having an active surface with a plurality of conductive bumps formed thereon and an interposer substrate having a first surface and a second surface, a plurality of recesses formed therein extending from the first surface and at least one opening formed in the interposer substrate extending therethrough, the at least one opening extending to at least some of the plurality of recesses, the active surface of the semiconductor die being mounted adjacent to the first surface of the interposer substrate so that the conductive bumps of the semiconductor die are disposed in the plurality of recesses of the interposer substrate and leave a gap adjacent a portion of at least some of the bumps in the plurality of recesses; and introducing a flowable material through the at least one opening sufficient to extend to and at least partially fill at least some of the gaps.

65. The method of claim 64, wherein the providing the interposer substrate comprises forming the at least one opening in the second surface of the interposer substrate to include one or more passages extending to a lower portion of at least one of the plurality of recesses.

66. The method of claim 65, wherein the providing the interposer substrate comprises forming the at least one opening in the second surface of the interposer substrate as a plurality of openings, each of the plurality of openings corresponding to at least one of the plurality of recesses and extending thereto.

67. The method of claim 65, wherein the introducing comprises applying the flowable material to the at least one opening in the interposer substrate to flow into the at least one opening and through the one or more passages to at least partially fill at least one of the gaps.

68. The method of claim 66, wherein the introducing comprises applying the flowable material to the plurality of openings in the interposer substrate to flow into each of the plurality of openings and through the one or more passages to fill at least some of the gaps.

69. The method of claim 67, wherein the applying the flowable material comprises dispensing the flowable material under pressure.

70. The method of claim 68, wherein the applying the flowable material comprises dispensing the flowable material under pressure.

71. The method of claim 64, wherein the providing the interposer substrate with at least one opening comprises forming a channel in the first surface of the interposer substrate.

72. The method of claim 71, wherein the forming comprises extending the channel from a periphery of the interposer substrate to at least an interior portion of the interposer substrate.

73. The method of claim 72, wherein the extending the channel comprises aligning the channel beside at least some of the plurality of recesses so that each of the at least some recesses opens into a portion of the channel.

74. The method of claim 73, wherein the introducing comprises introducing the flowable material into the channel to flow therethrough and into each of the gaps.

75. The method of claim 74, wherein the applying the flowable material comprises dispensing the flowable material under pressure.

* * * * *

UNITED STATES PATENT AND TRADEMARK OFFICE
CERTIFICATE OF CORRECTION

PATENT NO. : 6,975,035 B2
APPLICATION NO. : 10/150902
DATED : December 13, 2005
INVENTOR(S) : Lee It is certified that error appears in the above-identified patent and that said Letters Patent is hereby corrected as shown below:

In column 27, line 2, in Claim 56, after "with" delete "said".

Signed and Sealed this

Fifteenth Day of April, 2008

JON W. DUDAS
*Director of the United States Patent and Trademark Office*